US010887791B2

(12) United States Patent
Sun et al.

(10) Patent No.: US 10,887,791 B2
(45) Date of Patent: Jan. 5, 2021

(54) TECHNIQUES AND APPARATUSES FOR LOW DENSITY PARITY CHECK BASE GRAPH DETERMINATION AND INDICATION

(71) Applicant: QUALCOMM Incorporated, San Diego, CA (US)

(72) Inventors: Jing Sun, San Diego, CA (US); Tao Luo, San Diego, CA (US); Peter Gaal, San Diego, CA (US); Wanshi Chen, San Diego, CA (US); Joseph Binamira Soriaga, San Diego, CA (US); Shimman Arvind Patel, San Diego, CA (US); Alexandros Manolakos, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 49 days.

(21) Appl. No.: 16/041,100

(22) Filed: Jul. 20, 2018

(65) Prior Publication Data

US 2019/0037437 A1    Jan. 31, 2019

(30) Foreign Application Priority Data

Jul. 28, 2017  (GR) .............................. 20170100356

(51) Int. Cl.
*H04W 28/04* (2009.01)
*H03M 13/35* (2006.01)
(Continued)

(52) U.S. Cl.
CPC ......... *H04W 28/04* (2013.01); *H03M 13/353* (2013.01); *H03M 13/356* (2013.01);
(Continued)

(58) Field of Classification Search
CPC . H04W 28/04; H03M 13/353; H03M 13/356; H04L 1/0003; H04L 1/0013;
(Continued)

(56) References Cited

U.S. PATENT DOCUMENTS

| 2019/0028229 | A1* | 1/2019 | Yeo | ....................... H04L 5/0053 |
| 2019/0132082 | A1* | 5/2019 | Ma | ......................... H04L 1/1819 |
| 2019/0394000 | A1* | 12/2019 | Kim | ....................... H04W 72/04 |

OTHER PUBLICATIONS

Ericsson: "LDPC Code Performance for High Reliability Use Cases", 3GPP Draft; R1-1710499 LDPC Code Performance for High Reliability Use Cases, 3rd Generation Partnership Project (3GPP), Mobile Competence Centre; 650, Route Des Lucioles; F-06921 Sophia-Antipolis CE, vol. RAN WG1, No. Qingdao, P.R. China; Jun. 27, 2017-Jun. 30, 2017, Jun. 26, 2017 (Jun. 26, 2017), pp. 1-6, XP051299707, Retrieved from the Internet: URL: http://www.3gpp.org/ftp/Meetings_3GPP_SYNC/RAN1/Docs/ [retrieved on Jun. 26, 2017].

(Continued)

*Primary Examiner* — Eric Myers
(74) *Attorney, Agent, or Firm* — Harrity & Harrity, LLP/ QUALCOMM Incorporated

(57) ABSTRACT

Certain aspects of the present disclosure generally relate to wireless communication. In some aspects, a device may determine a nominal coding rate of a communication based at least in part on a modulation and coding scheme (MCS) of the communication; determine whether to use a first base graph or a second base graph for decoding or transmission of the communication, wherein the determination of whether to use the first base graph or the second base graph is based at least in part on the nominal coding rate and a transport block size (TBS) of the communication, and wherein the TBS is based at least in part on a nominal number of resources and the MCS of the communication; and perform the decoding or transmission based at least in part on the (Continued)

determination of whether to use the first base graph or the second base graph. Numerous other aspects are provided.

32 Claims, 12 Drawing Sheets

(51) Int. Cl.
  *H04L 1/00* (2006.01)
  *H04L 1/18* (2006.01)
  *H03M 13/11* (2006.01)
(52) U.S. Cl.
  CPC .......... *H04L 1/0003* (2013.01); *H04L 1/0013* (2013.01); *H04L 1/0025* (2013.01); *H04L 1/0057* (2013.01); *H04L 1/0075* (2013.01); *H04L 1/1845* (2013.01); *H03M 13/116* (2013.01)
(58) Field of Classification Search
  CPC ... H04L 1/0025; H04L 1/0057; H04L 1/0075; H04L 1/1845
  See application file for complete search history.

(56) References Cited

OTHER PUBLICATIONS

Intel Corporation: "LDPC Coding chain", 3GPP Draft; R1-1711344, 3rd Generation Partnership Project (3GPP), Mobile Competence Centre; 650, Route Des Lucioles; F-06921 Sophia-Antipolis Cedex; France, vol. RAN WG1, No. Qingdao, P.R. China; Jun. 27, 2017-Jun. 30, 2017, Jun. 20, 2017 (Jun. 20, 2017), pp. 1-6, XP051305812, Retrieved from the Internet: URL: http://www.3gpp.org/ftp/tsg_ran/WG1_RL1/TSGR1_AH/NR_AH_1706/Docs/ [retrieved on Jun. 20, 2017].

International Search Report and Written Opinion—PCT/US2018/043306—ISA/EPO—dated Nov. 6, 2018.

LG Electronics: "Discussion on TB Size Determination for NR", 3GPP Draft; R1-1710325 Discussion on TB Size Determination for NR_Final, 3rd Generation Partnership Project (3GPP), Mobile Competence Centre; 650, Route Des Lucioles; F-06921 Sophia-Antipolis Cedex, vol. RAN WG1, No. Qingdao, P.R. China; Jun. 27, 2017-Jun. 30, 2017, Jun. 17, 2017 (Jun. 17, 2017), 2 Pages, XP051304956, Retrieved from the Internet: URL: http://www.3gpp.org/ftp/tsg_ran/WG1_RL1/TSGR1_AH/NR_AH_1706/Docs/ [retrieved on Jun. 17, 2017].

Mediatek, et al., "WF on LDPC Code Usage Scenarios", 3GPP Draft; R1-1711731 WF on LDPC Code Usage Scenarios, 3rd Generation Partnership Project (3GPP), Mobile Competence Centre; 650, Route Des Lucioles; F-06921 Sophia-Antipolis Cedex; France, vol. RAN WG1, No. Qingdao, China; Jun. 27, 2017-Jun. 30, 2017, Jul. 1, 2017 (Jul. 1, 2017), 4 Pages, XP051306110, Retrieved from the Internet: URL: http://www.3gpp.org/ftp/tsg_ran/WG1_RL1/TSGR1_AH/NR_AH_1706/Docs/ [retrieved on Jul. 1, 2017].

QUALCOMM Incorporated: "LDPC Base Graph Determination and Indication", 3GPP Draft; R1-1713463 LDPC Base Graph Determination and Indication, 3rd Generation Partnership Project (3GPP), Mobile Competence Centre; 650, Route Des Lucioles; F-06921 Sophia-Antipolis Cedex; FR, vol. RAN WG1, No. Prague, Czech Republic; Aug. 21, 2017-Aug. 25, 2017, Aug. 20, 2017 (Aug. 20, 2017), pp. 1-5, XP051316264, Retrieved from the Internet: URL: http://www.3gpp.org/ftp/Meetings_3GPP_SYNC/RAN1/Docs/ [retrieved on Aug. 20, 2017].

* cited by examiner

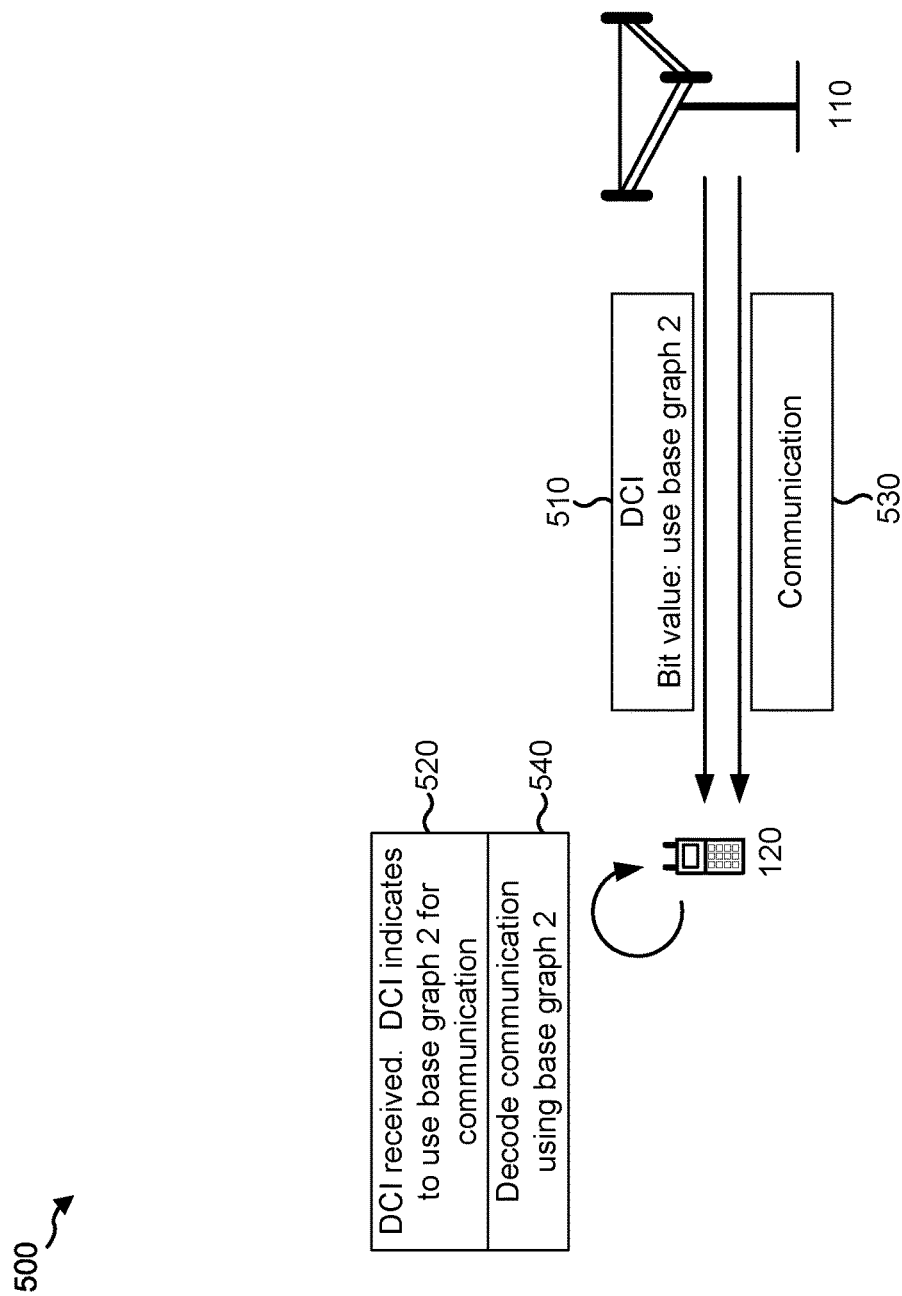

TECHNIQUES AND APPARATUSES FOR LOW DENSITY PARITY CHECK BASE GRAPH DETERMINATION AND INDICATION

CROSS-REFERENCE TO RELATED APPLICATIONS UNDER 35 U.S.C. § 119

This application claims priority to Greek Patent Application No. 20170100356, filed on Jul. 28, 2017, entitled "TECHNIQUES AND APPARATUSES FOR LOW DENSITY PARITY CHECK BASE GRAPH DETERMINATION AND INDICATION," which is hereby expressly incorporated by reference herein.

FIELD OF THE DISCLOSURE

Aspects of the present disclosure generally relate to wireless communication, and more particularly to techniques and apparatuses for low density parity check (LDPC) base graph determination and indication.

BACKGROUND

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power, etc.). Examples of such multiple-access technologies include code division multiple access (CDMA) systems, time division multiple access (TDMA) systems, frequency-division multiple access (FDMA) systems, orthogonal frequency-division multiple access (OFDMA) systems, single-carrier frequency-division multiple access (SC-FDMA) systems, time division synchronous code division multiple access (TD-SCDMA) systems, and Long Term Evolution (LTE). LTE/LTE-Advanced is a set of enhancements to the Universal Mobile Telecommunications System (UMTS) mobile standard promulgated by the Third Generation Partnership Project (3GPP).

A wireless communication network may include a number of base stations (BSs) that can support communication for a number of user equipment (UEs). A user equipment (UE) may communicate with a base station (BS) via the downlink and uplink. The downlink (or forward link) refers to the communication link from the BS to the UE, and the uplink (or reverse link) refers to the communication link from the UE to the BS. As will be described in more detail herein, a BS may be referred to as a Node B, a gNB, an access point (AP), a radio head, a transmit receive point (TRP), a new radio (NR) BS, a 5G Node B, and/or the like.

The above multiple access technologies have been adopted in various telecommunication standards to provide a common protocol that enables different user equipment to communicate on a municipal, national, regional, and even global level. New radio (NR), which may also be referred to as 5G, is a set of enhancements to the LTE mobile standard promulgated by the Third Generation Partnership Project (3GPP). NR is designed to better support mobile broadband Internet access by improving spectral efficiency, lowering costs, improving services, making use of new spectrum, and better integrating with other open standards using orthogonal frequency division multiplexing (OFDM) with a cyclic prefix (CP) (CP-OFDM) on the downlink (DL), using CP-OFDM and/or SC-FDM (e.g., also known as discrete Fourier transform spread OFDM (DFT-s-OFDM)) on the uplink (UL), as well as supporting beamforming, multiple-input multiple-output (MIMO) antenna technology, and carrier aggregation.

SUMMARY

In some aspects, a method for wireless communication performed by a device may include receiving or determining an indication of whether to use a first base graph or a second base graph to decode or transmit a communication based at least in part on an LDPC technique; and/or decoding or transmitting the communication using one of the first base graph or the second base graph based at least in part on the indication.

In some aspects, a device for wireless communication may include one or more processors configured to receive or determine an indication of whether to use a first base graph or a second base graph to decode or transmit a communication based at least in part on an LDPC technique; and/or decode or transmit the communication using one of the first base graph or the second base graph based at least in part on the indication.

In some aspects, a non-transitory computer-readable medium may store one or more instructions for wireless communication. The one or more instructions, when executed by one or more processors of a device, may cause the one or more processors to receive or determine an indication of whether to use a first base graph or a second base graph to decode or transmit a communication based at least in part on an LDPC technique; and/or decode or transmit the communication using one of the first base graph or the second base graph based at least in part on the indication.

In some aspects, an apparatus for wireless communication may include means for receiving or determining an indication of whether to use a first base graph or a second base graph to decode or transmit a communication based at least in part on an LDPC technique; and/or means for decoding or transmitting the communication using one of the first base graph or the second base graph based at least in part on the indication.

In some aspects, a method for wireless communication performed by a device may include determining a nominal number of resource blocks for a communication based at least in part on a resource block allocation and a set of symbols assigned to the device; determining a nominal coding rate of the communication based at least in part on at least one of a modulation and coding scheme (MCS) of the communication or a transport block size of the communication; and/or determining whether to use a first base graph or a second base graph, associated with respective low density parity check codes, for decoding or transmission of the communication, wherein the determination of whether to use the first base graph or the second base graph is based at least in part on the nominal number of resource blocks and the nominal coding rate.

In some aspects, a device for wireless communication may include one or more processors configured to determine a nominal number of resource blocks for a communication based at least in part on a resource block allocation and a set of symbols assigned to the device; determine a nominal coding rate of the communication based at least in part on at least one of a modulation and coding scheme (MCS) of the communication or a transport block size of the communication; and/or determine whether to use a first base graph or a second base graph, associated with respective low density parity check codes, for decoding or transmission of the communication, wherein the determination of whether to use the first base graph or the second base graph is based at least in part on the nominal number of resource blocks and the nominal coding rate.

In some aspects, a non-transitory computer-readable medium may store one or more instructions for wireless communication. The one or more instructions, when executed by one or more processors of a device, may cause the one or more processors to determine a nominal number of resource blocks for a communication based at least in part on a resource block allocation and a set of symbols assigned to the device; determine a nominal coding rate of the communication based at least in part on at least one of a modulation and coding scheme (MCS) of the communication or a transport block size of the communication; and/or determine whether to use a first base graph or a second base graph, associated with respective low density parity check codes, for decoding or transmission of the communication, wherein the determination of whether to use the first base graph or the second base graph is based at least in part on the nominal number of resource blocks and the nominal coding rate.

In some aspects, an apparatus for wireless communication may include means for determining a nominal number of resource blocks for a communication based at least in part on a resource block allocation and a set of symbols assigned to the apparatus; means for determining a nominal coding rate of the communication based at least in part on at least one of a modulation and coding scheme (MCS) of the communication or a transport block size of the communication; and/or means for determining whether to use a first base graph or a second base graph, associated with respective low density parity check codes, for decoding or transmission of the communication, wherein the determination of whether to use the first base graph or the second base graph is based at least in part on the nominal number of resource blocks and the nominal coding rate.

In some aspects, a method for wireless communication performed by a device may include determining a nominal coding rate of a communication based at least in part on a modulation and coding scheme (MCS) of the communication; determining whether to use a first base graph or a second base graph for decoding or transmission of the communication, wherein the determination of whether to use the first base graph or the second base graph is based at least in part on the nominal coding rate and a transport block size (TBS) of the communication, and wherein the TBS is based at least in part on a nominal number of resources and the MCS of the communication; and performing the decoding or transmission based at least in part on the determination of whether to use the first base graph or the second base graph.

In some aspects, a device for wireless communication may include memory and one or more processors operatively coupled to the memory. The memory and the one or more processors may be configured to determine a nominal coding rate of a communication based at least in part on a modulation and coding scheme (MCS) of the communication; determine whether to use a first base graph or a second base graph for decoding or transmission of the communication, wherein the determination of whether to use the first base graph or the second base graph is based at least in part on the nominal coding rate and a transport block size (TBS) of the communication, and wherein the TBS is based at least in part on a nominal number of resources and the MCS of the communication; and perform the decoding or transmission based at least in part on the determination of whether to use the first base graph or the second base graph.

In some aspects, a non-transitory computer-readable medium may store one or more instructions for wireless communication. The one or more instructions, when executed by one or more processors of a device, may cause the one or more processors to determine a nominal coding rate of a communication based at least in part on a modulation and coding scheme (MCS) of the communication; determine whether to use a first base graph or a second base graph for decoding or transmission of the communication, wherein the determination of whether to use the first base graph or the second base graph is based at least in part on the nominal coding rate and a transport block size (TBS) of the communication, and wherein the TBS is based at least in part on a nominal number of resources and the MCS of the communication; and perform the decoding or transmission based at least in part on the determination of whether to use the first base graph or the second base graph.

In some aspects, an apparatus for wireless communication may include means for determining a nominal coding rate of a communication based at least in part on a modulation and coding scheme (MCS) of the communication; means for determining whether to use a first base graph or a second base graph for decoding or transmission of the communication, wherein the determination of whether to use the first base graph or the second base graph is based at least in part on the nominal coding rate and a transport block size (TBS) of the communication, and wherein the TBS is based at least in part on a nominal number of resources and the MCS of the communication; and means for performing the decoding or transmission based at least in part on the determination of whether to use the first base graph or the second base graph.

Aspects generally include a method, apparatus, system, computer program product, non-transitory computer-readable medium, user equipment, wireless communication device, and processing system as substantially described herein with reference to and as illustrated by the accompanying drawings.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purpose of illustration and description, and not as a definition of the limits of the claims.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects. The same reference numbers in different drawings may identify the same or similar elements.

FIGS. 5A and 5B are diagrams illustrating examples of LDPC base graph determination and indication, in accordance with various aspects of the present disclosure.

DETAILED DESCRIPTION

Figure 1:
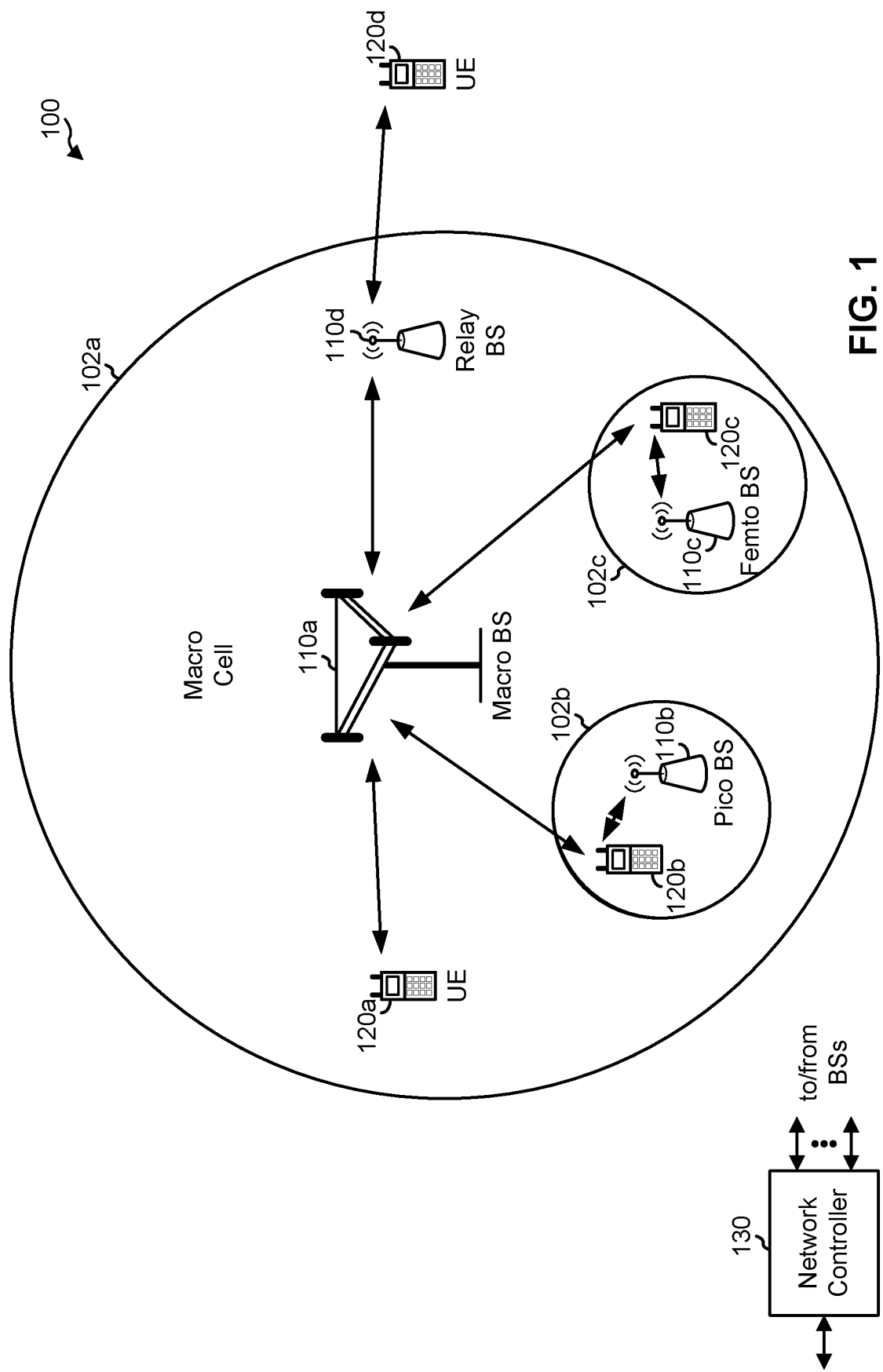
FIG. 1 is a block diagram conceptually illustrating an example of a wireless communication network, in accordance with certain aspects of the present disclosure.

A communication from a transmitting entity (e.g., a UE or a BS) to a receiving entity (e.g., another UE and/or another BS) may be encoded based at least in part on an error correcting code, so that the receiving entity can determine whether the communication was properly transmitted to the receiving entity. One example of an error correcting code is a low density parity check (LDPC) code. A communication may be encoded based at least in part on an LDPC code to provide for error detection at the receiving entity. Encoding for an LDPC may be performed based at least in part on a base graph, which is a sparse bipartite graph. The base graph may identify a code word to be generated from an input data set and/or may identify information to be appended to an input data set to form the LDPC.

In some cases, one base graph may provide better performance than another base graph. For example, LDPC has been adopted as one error correction code. In some instances, a first base graph may be used for a communication when a code block size of the communication satisfies a first threshold or a code rate of the communication satisfies a second threshold. A second base graph may be used for the communication when the code block size does not satisfy the first threshold and/or the code rate does not satisfy the second threshold. As a more particular example, the first threshold may be approximately 2560 bits and the second threshold may be a ratio of approximately 0.67. The second base graph may provide improved performance in situations wherein the transport block is small and the code rate is low.

However, for repetitious transmissions (e.g., a first transmission and a retransmission of a communication), the usage of two or more base graphs may lead to certain difficulties. In one example, an eNB transmits a communication to a UE, but the UE may not receive a grant for the first transmission of the communication, and therefore fails to fully receive and decode the first transmission. In such a case, the UE may still be able to perform a soft combination of the first transmission and the retransmission, but only if the UE can successfully identify which base graph and/or code rate is to be used for the retransmission. Since the UE did not receive the grant for the first transmission, the UE may not know which base graph was used for the first transmission, and therefore may not know which base graph is to be used for the retransmission. This may lead to failure of decoding of the retransmission.

Techniques and apparatuses described herein provide for signaling of, or identification of, a base graph to be used to decode a transmission. For example, some techniques and apparatuses described herein may provide for explicit signaling of which base graph to use. Additionally, or alternatively, some techniques and apparatuses may provide for identification of a base graph based at least in part on a grant for a communication.

Furthermore, some techniques and apparatuses may handle base graph selection for retransmission. For example, retransmissions may create difficulty in that a retransmission needs to be associated with a same transport block size as a first transmission. When the same transport block size can be associated with two or more base graphs, confusion may arise as to which base graph should be used to decode the retransmission, especially when the first transmission or a grant associated with the first transmission was not received. Some techniques and apparatuses described herein provide for handling of such a situation, by configuring a table for selection of base graphs so that such a situation is gracefully handled. Thus, success of retransmission is improved and a likelihood of data loss due to incorrect decoding of retransmissions is reduced.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

Several aspects of telecommunication systems will now be presented with reference to various apparatuses and techniques. These apparatuses and techniques will be described in the following detailed description and illustrated in the accompanying drawings by various blocks, modules, components, circuits, steps, processes, algorithms, etc. (collectively referred to as "elements"). These elements may be implemented using hardware, software, or combinations thereof. Whether such elements are implemented as hardware or software depends upon the particular application and design constraints imposed on the overall system.

It is noted that while aspects may be described herein using terminology commonly associated with 3G and/or 4G wireless technologies, aspects of the present disclosure can be applied in other generation-based communication systems, such as 5G and later, including NR technologies.

FIG. 1 is a diagram illustrating a network 100 in which aspects of the present disclosure may be practiced. The network 100 may be an LTE network or some other wireless network, such as a 5G or NR network. Wireless network 100 may include a number of BSs 110 (shown as BS 110a, BS 110b, BS 110c, and BS 110d) and other network entities. A BS is an entity that communicates with user equipment (UEs) and may also be referred to as a base station, a NR BS, a Node B, a gNB, a 5G node B (NB), an access point, a transmit receive point (TRP), and/or the like. Each BS may provide communication coverage for a particular geographic area. In 3GPP, the term "cell" can refer to a coverage area of a BS and/or a BS subsystem serving this coverage area, depending on the context in which the term is used.

A BS may provide communication coverage for a macro cell, a pico cell, a femto cell, and/or another type of cell. A macro cell may cover a relatively large geographic area (e.g., several kilometers in radius) and may allow unrestricted access by UEs with service subscription. A pico cell may cover a relatively small geographic area and may allow unrestricted access by UEs with service subscription. A femto cell may cover a relatively small geographic area (e.g., a home) and may allow restricted access by UEs having association with the femto cell (e.g., UEs in a closed subscriber group (CSG)). A BS for a macro cell may be referred to as a macro BS. A BS for a pico cell may be referred to as a pico BS. A BS for a femto cell may be referred to as a femto BS or a home BS. In the example shown in FIG. 1, a BS 110a may be a macro BS for a macro cell 102a, a BS 110b may be a pico BS for a pico cell 102b, and a BS 110c may be a femto BS for a femto cell 102c. A BS may support one or multiple (e.g., three) cells. The terms "eNB", "base station", "NR BS", "gNB", "TRP", "AP", "node B", "5G NB", and "cell" may be used interchangeably herein.

In some examples, a cell may not necessarily be stationary, and the geographic area of the cell may move according to the location of a mobile BS. In some examples, the BSs may be interconnected to one another and/or to one or more other BSs or network nodes (not shown) in the access network 100 through various types of backhaul interfaces such as a direct physical connection, a virtual network, and/or the like using any suitable transport network.

Wireless network 100 may also include relay stations. A relay station is an entity that can receive a transmission of data from an upstream station (e.g., a BS or a UE) and send a transmission of the data to a downstream station (e.g., a UE or a BS). A relay station may also be a UE that can relay transmissions for other UEs. In the example shown in FIG. 1, a relay station 110d may communicate with macro BS 110a and a UE 120d in order to facilitate communication between BS 110a and UE 120d. A relay station may also be referred to as a relay BS, a relay base station, a relay, etc.

Wireless network 100 may be a heterogeneous network that includes BSs of different types, e.g., macro BSs, pico BSs, femto BSs, relay BSs, etc. These different types of BSs may have different transmit power levels, different coverage areas, and different impact on interference in wireless network 100. For example, macro BSs may have a high transmit power level (e.g., 5 to 40 Watts) whereas pico BSs, femto BSs, and relay BSs may have lower transmit power levels (e.g., 0.1 to 2 Watts).

A network controller 130 may couple to a set of BSs and may provide coordination and control for these BSs. Network controller 130 may communicate with the BSs via a backhaul. The BSs may also communicate with one another, e.g., directly or indirectly via a wireless or wireline backhaul.

UEs 120 (e.g., 120a, 120b, 120c) may be dispersed throughout wireless network 100, and each UE may be stationary or mobile. A UE may also be referred to as an access terminal, a terminal, a mobile station, a subscriber unit, a station, etc. A UE may be a cellular phone (e.g., a smart phone), a personal digital assistant (PDA), a wireless modem, a wireless communication device, a handheld device, a laptop computer, a cordless phone, a wireless local loop (WLL) station, a tablet, a camera, a gaming device, a netbook, a smartbook, an ultrabook, medical device or equipment, biometric sensors/devices, wearable devices (smart watches, smart clothing, smart glasses, smart wrist bands, smart jewelry (e.g., smart ring, smart bracelet)), an entertainment device (e.g., a music or video device, or a satellite radio), a vehicular component or sensor, smart meters/sensors, industrial manufacturing equipment, a global positioning system device, or any other suitable device that is configured to communicate via a wireless or wired medium.

Some UEs may be considered machine-type communication (MTC) or evolved or enhanced machine-type communication (eMTC) UEs. MTC and eMTC UEs include, for example, robots, drones, remote devices, such as sensors, meters, monitors, location tags, etc., that may communicate with a base station, another device (e.g., remote device), or some other entity. A wireless node may provide, for example, connectivity for or to a network (e.g., a wide area network such as Internet or a cellular network) via a wired or wireless communication link. Some UEs may be considered Internet-of-Things (IoT) devices, and/or may be implemented as NB-IoT (narrowband internet of things) devices. Some UEs may be considered a Customer Premises Equipment (CPE). UE 120 may be included inside a housing 120' that houses components of UE 120, such as processor components, memory components, and/or the like.

In general, any number of wireless networks may be deployed in a given geographic area. Each wireless network may support a particular RAT and may operate on one or more frequencies. A RAT may also be referred to as a radio technology, an air interface, etc. A frequency may also be referred to as a carrier, a frequency channel, etc. Each frequency may support a single RAT in a given geographic area in order to avoid interference between wireless networks of different RATs. In some cases, NR or 5G RAT networks may be deployed.

In some examples, access to the air interface may be scheduled, wherein a scheduling entity (e.g., a base station) allocates resources for communication among some or all devices and equipment within the scheduling entity's service area or cell. Within the present disclosure, as discussed further below, the scheduling entity may be responsible for scheduling, assigning, reconfiguring, and releasing resources for one or more subordinate entities. That is, for scheduled communication, subordinate entities utilize resources allocated by the scheduling entity.

Base stations are not the only entities that may function as a scheduling entity. That is, in some examples, a UE may function as a scheduling entity, scheduling resources for one or more subordinate entities (e.g., one or more other UEs). In this example, the UE is functioning as a scheduling entity, and other UEs utilize resources scheduled by the UE for wireless communication. A UE may function as a scheduling entity in a peer-to-peer (P2P) network, and/or in a mesh network. In a mesh network example, UEs may optionally communicate directly with one another in addition to communicating with the scheduling entity.

Thus, in a wireless communication network with a scheduled access to time-frequency resources and having a cellular configuration, a P2P configuration, and a mesh configuration, a scheduling entity and one or more subordinate entities may communicate utilizing the scheduled resources.

As indicated above, FIG. 1 is provided merely as an example. Other examples are possible and may differ from what was described with regard to FIG. 1.

Figure 2:
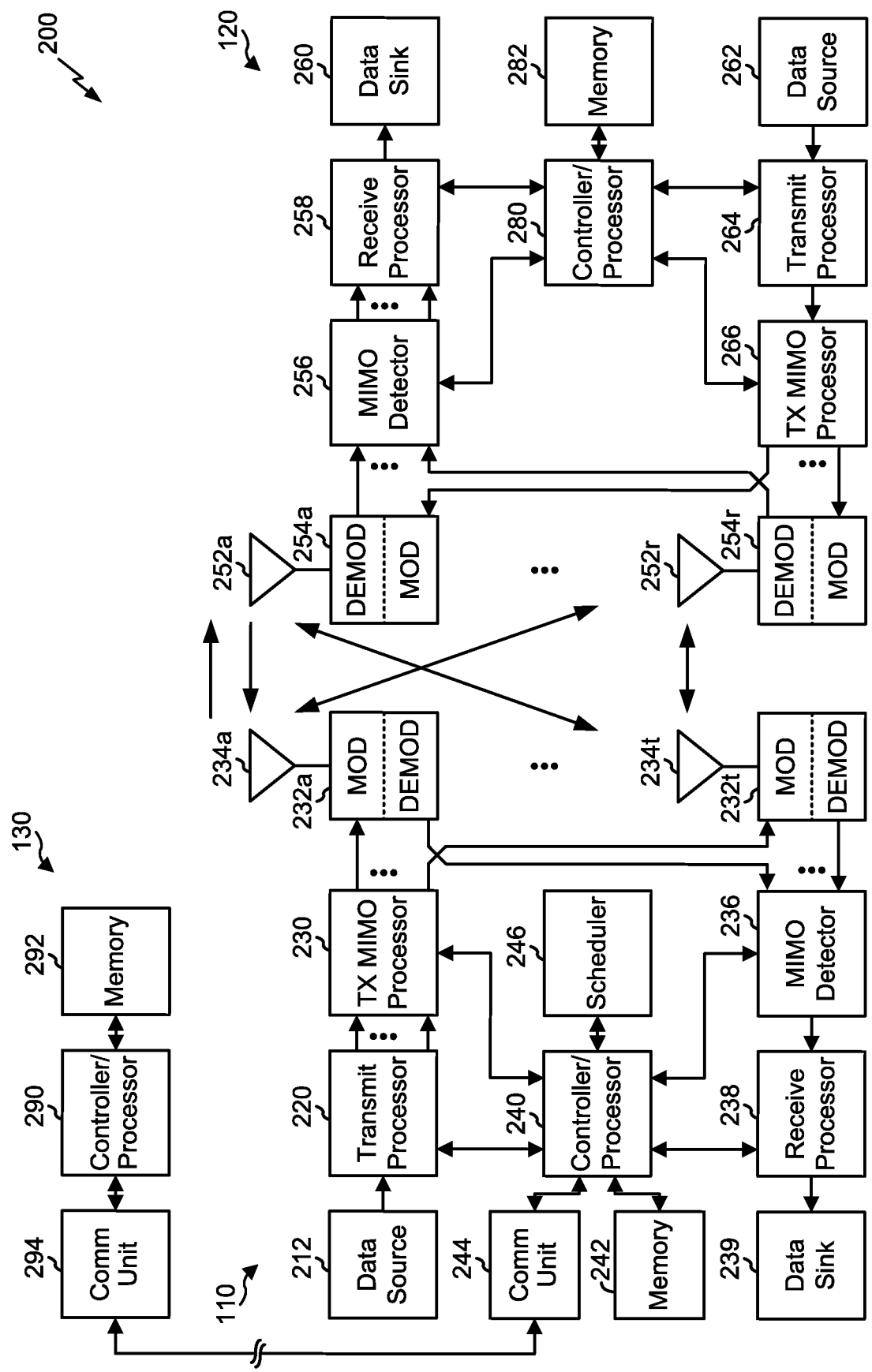
FIG. 2 shows a block diagram conceptually illustrating an example of a base station in communication with a user equipment (UE) in a wireless communication network, in accordance with certain aspects of the present disclosure.

FIG. 2 shows a block diagram of a design of base station 110 and UE 120, which may be one of the base stations and one of the UEs in FIG. 1. Base station 110 may be equipped with T antennas 234a through 234t, and UE 120 may be equipped with R antennas 252a through 252r, where in general T≥1 and R≥1.

At base station 110, a transmit processor 220 may receive data from a data source 212 for one or more UEs, select one or more modulation and coding schemes (MCS) for each UE based at least in part on channel quality indicators (CQIs) received from the UE, process (e.g., encode and modulate) the data for each UE based at least in part on the MCS(s) selected for the UE, and provide data symbols for all UEs. In some aspects, the transmit processor 220 may select an MCS to achieve a particular base graph for LDPC transmission, as described in more detail elsewhere herein. Transmit processor 220 may also process system information (e.g., for semi-static resource partitioning information (SRPI), etc.) and control information (e.g., CQI requests, grants, upper layer signaling, etc.) and provide overhead symbols and control symbols. Transmit processor 220 may also generate reference symbols for reference signals (e.g., the cell-specific reference signal (CRS)) and synchronization signals (e.g., the primary synchronization signal (PSS) and secondary synchronization signal (SSS)). A transmit (TX) multiple-input multiple-output (MIMO) processor 230 may perform spatial processing (e.g., precoding) on the data symbols, the control symbols, the overhead symbols, and/or the reference symbols, if applicable, and may provide T output symbol streams to T modulators (MODs) 232a through 232t. Each modulator 232 may process a respective output symbol stream (e.g., for OFDM, etc.) to obtain an output sample stream. Each modulator 232 may further process (e.g., convert to analog, amplify, filter, and upconvert) the output sample stream to obtain a downlink signal. T downlink signals from modulators 232a through 232t may be transmitted via T antennas 234a through 234t, respectively. According to certain aspects described in more detail below, the synchronization signals can be generated with location encoding to convey additional information.

At UE 120, antennas 252a through 252r may receive the downlink signals from base station 110 and/or other base stations and may provide received signals to demodulators (DEMODs) 254a through 254r, respectively. Each demodulator 254 may condition (e.g., filter, amplify, downconvert, and digitize) a received signal to obtain input samples. Each demodulator 254 may further process the input samples (e.g., for OFDM, etc.) to obtain received symbols. A MIMO detector 256 may obtain received symbols from all R demodulators 254a through 254r, perform MIMO detection on the received symbols if applicable, and provide detected symbols. A receive processor 258 may process (e.g., demodulate and decode) the detected symbols, provide decoded data for UE 120 to a data sink 260, and provide decoded control information and system information to a controller/processor 280. In some aspects, the receive processor 258 and/or the controller/processor 280 may demodulate and decode the detected symbols based at least in part on a base graph for an LDPC code. A channel processor may determine reference signal received power (RSRP), received signal strength indicator (RSSI), reference signal received quality (RSRQ), channel quality indicator (CQI), etc.

On the uplink, at UE 120, a transmit processor 264 may receive and process data from a data source 262 and control information (e.g., for reports comprising RSRP, RSSI, RSRQ, CQI, etc.) from controller/processor 280. Transmit processor 264 may also generate reference symbols for one or more reference signals. The symbols from transmit processor 264 may be precoded by a TX MIMO processor 266 if applicable, further processed by modulators 254a through 254r (e.g., for DFT-s-OFDM, CP-OFDM, etc.), and transmitted to base station 110. At base station 110, the uplink signals from UE 120 and other UEs may be received by antennas 234, processed by demodulators 232, detected by a MIMO detector 236 if applicable, and further processed by a receive processor 238 to obtain decoded data and control information sent by UE 120. Receive processor 238 may provide the decoded data to a data sink 239 and the decoded control information to controller/processor 240. Base station 110 may include communication unit 244 and communicate to network controller 130 via communication unit 244. Network controller 130 may include communication unit 294, controller/processor 290, and memory 292.

In some aspects, one or more components of UE 120 may be included in a housing. Controllers/processors 240 and 280 and/or any other component(s) in FIG. 2 may direct the operation at base station 110 and UE 120, respectively, to perform LDPC base graph determination and indication. For example, controller/processor 280 and/or other processors and modules at UE 120, and/or controller/processor 240 and/or other processors and modules at BS 110, may perform or direct operations of UE 120 and/or BS 110 to perform LDPC base graph determination and indication. For example, controller/processor 240/280 and/or other controllers/processors and modules at UE 120 and/or BS 110 may perform or direct operations of, for example, process 800 of FIG. 8, process 900 of FIG. 9, and/or other processes as described herein. In some aspects, one or more of the components shown in FIG. 2 may be employed to perform example process 800, example process 900, and/or other processes for the techniques described herein. Memories 242 and 282 may store data and program codes for base station 110 and UE 120, respectively. The stored program codes, when executed by processor 280 and/or other processors and modules at UE 120, may cause the UE 120 to perform operations described with respect to process 800 of FIG. 8, process 900 of FIG. 9, and/or other processes as described herein. A scheduler 246 may schedule UEs for data transmission on the downlink and/or uplink.

While blocks in FIG. 2 are illustrated as distinct components, the functions described above with respect to the blocks may be implemented in a single hardware, software, or combination component or in various combinations of components. For example, the functions described with respect to the transmit processor 264, the receive processor 258, or the TX MIMO processor 266 may be performed by or under the control of controller/processor 280.

In some aspects, one or more components of UE 120 may be included in a housing. Controllers/processors 240 and 280 and/or any other component(s) in FIG. 2 may direct the operation at base station 110 and UE 120, respectively, to perform LDPC base graph determination and indication. For example, controller/processor 280 and/or other processors and modules at UE 120, and/or controller/processor 240 and/or other processors and modules at BS 110, may perform or direct operations of UE 120 and/or BS 110 to perform LDPC base graph determination and indication. For example, controller/processor 240/280 and/or other controllers/processors and modules at UE 120 and/or BS 110 may perform or direct operations of, for example, process 800 of FIG. 8, process 900 of FIG. 9, process 1000 of FIG. 10, and/or other processes as described herein. In some aspects, one or more of the components shown in FIG. 2 may be employed to perform example process 800, example process 900, example process 1000 and/or other processes for the techniques described herein. Memories 242 and 282 may store data and program codes for base station 110 and UE 120, respectively. The stored program codes, when executed by processor 280 and/or other processors and modules at UE 120, may cause the UE 120 to perform operations described with respect to process 800 of FIG. 8, process 900 of FIG. 9, process 1000 of FIG. 10, and/or other processes as described herein. A scheduler 246 may schedule UEs for data transmission on the downlink and/or uplink.

As indicated above, FIG. 2 is provided merely as an example. Other examples are possible and may differ from what was described with regard to FIG. 2.

Figure 3:
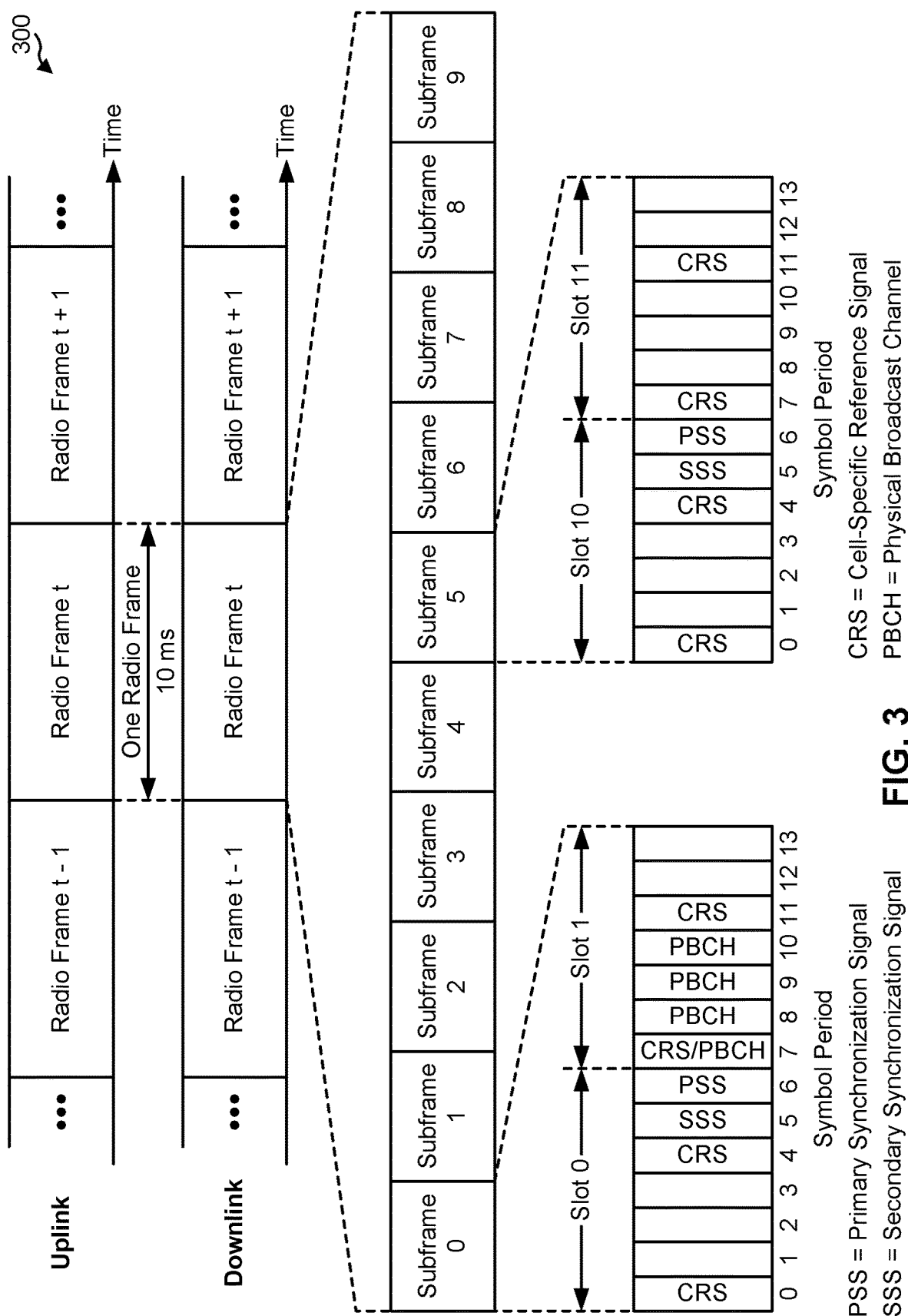
FIG. 3 is a block diagram conceptually illustrating an example of a frame structure in a wireless communication network, in accordance with certain aspects of the present disclosure.

FIG. 3 shows an example frame structure 300 for frequency division duplexing (FDD) in a telecommunications system (e.g., LTE). The transmission timeline for each of the downlink and uplink may be partitioned into units of radio frames. Each radio frame may have a predetermined duration (e.g., 10 milliseconds (ms)) and may be partitioned into 10 subframes with indices of 0 through 9. Each subframe may include two slots. Each radio frame may thus include 20 slots with indices of 0 through 19. Each slot may include L symbol periods, e.g., seven symbol periods for a normal cyclic prefix (as shown in FIG. 3) or six symbol periods for an extended cyclic prefix. The 2L symbol periods in each subframe may be assigned indices of 0 through 2L−1.

While some techniques are described herein in connection with frames, subframes, slots, and/or the like, these techniques may equally apply to other types of wireless communication structures, which may be referred to using terms other than "frame," "subframe," "slot," and/or the like in 5G NR. In some aspects, a wireless communication structure may refer to a periodic time-bounded communication unit defined by a wireless communication standard and/or protocol.

In certain telecommunications (e.g., LTE), a BS may transmit a primary synchronization signal (PSS) and a secondary synchronization signal (SSS) on the downlink in the center of the system bandwidth for each cell supported by the BS. The PSS and SSS may be transmitted in symbol periods 6 and 5, respectively, in subframes 0 and 5 of each radio frame with the normal cyclic prefix, as shown in FIG. 3. The PSS and SSS may be used by UEs for cell search and acquisition. The BS may transmit a cell-specific reference signal (CRS) across the system bandwidth for each cell supported by the BS. The CRS may be transmitted in certain symbol periods of each subframe and may be used by the UEs to perform channel estimation, channel quality measurement, and/or other functions. The BS may also transmit a physical broadcast channel (PBCH) in symbol periods 0 to 3 in slot 1 of certain radio frames. The PBCH may carry some system information. The BS may transmit other system information such as system information blocks (SIBs) on a physical downlink shared channel (PDSCH) in certain subframes. The BS may transmit control information/data on a physical downlink control channel (PDCCH) in the first B symbol periods of a subframe, where B may be configurable for each subframe. The BS may transmit traffic data and/or other data on the PDSCH in the remaining symbol periods of each subframe.

In other systems (e.g., such NR or 5G systems), a Node B may transmit these or other signals in these locations or in different locations of the subframe.

As indicated above, FIG. 3 is provided merely as an example. Other examples are possible and may differ from what was described with regard to FIG. 3.

Figure 4:
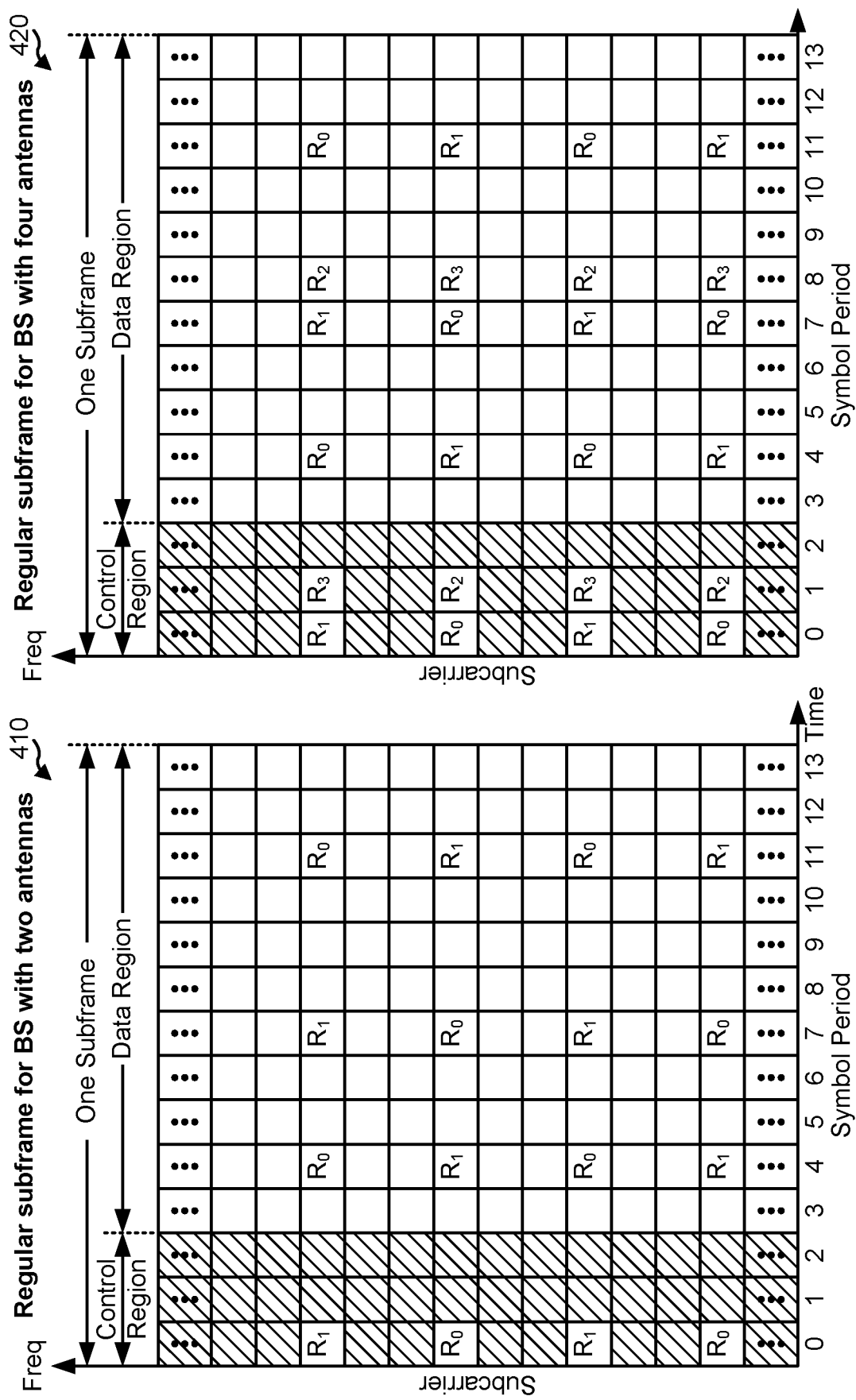
FIG. 4 is a block diagram conceptually illustrating two example subframe formats with the normal cyclic prefix, in accordance with certain aspects of the present disclosure.

FIG. 4 shows two example subframe formats 410 and 420 with the normal cyclic prefix. The available time frequency resources may be partitioned into resource blocks. Each resource block may cover 12 subcarriers in one slot and may include a number of resource elements. Each resource element may cover one subcarrier in one symbol period and may be used to send one modulation symbol, which may be a real or complex value.

Subframe format 410 may be used for two antennas. A CRS may be transmitted from antennas 0 and 1 in symbol periods 0, 4, 7, and 11. A reference signal is a signal that is known a priori by a transmitter and a receiver and may also be referred to as a pilot signal. A CRS is a reference signal that is specific for a cell, e.g., generated based at least in part on a cell identity (ID). In FIG. 4, for a given resource element with label Ra, a modulation symbol may be transmitted on that resource element from antenna a, and no modulation symbols may be transmitted on that resource element from other antennas. Subframe format 420 may be used with four antennas. A CRS may be transmitted from antennas 0 and 1 in symbol periods 0, 4, 7, and 11 and from antennas 2 and 3 in symbol periods 1 and 8. For both subframe formats 410 and 420, a CRS may be transmitted on evenly spaced subcarriers, which may be determined based at least in part on cell ID. CRSs may be transmitted on the same or different subcarriers, depending on their cell IDs. For both subframe formats 410 and 420, resource elements not used for the CRS may be used to transmit data (e.g., traffic data, control data, and/or other data).

The PSS, SSS, CRS and PBCH in LTE are described in 3GPP Technical Specification (TS) 36.211, entitled "Evolved Universal Terrestrial Radio Access (E-UTRA); Physical Channels and Modulation," which is publicly available.

An interlace structure may be used for each of the downlink and uplink for FDD in certain telecommunications systems (e.g., LTE). For example, Q interlaces with indices of 0 through Q−1 may be defined, where Q may be equal to 4, 6, 8, 10, or some other value. Each interlace may include subframes that are spaced apart by Q frames. In particular, interlace q may include subframes q, q+Q, q+2Q, etc., where $q \in \{0, \ldots, Q-1\}$.

The wireless network may support hybrid automatic retransmission request (HARQ) for data transmission on the downlink and uplink. For HARQ, a transmitter (e.g., a BS) may send one or more transmissions of a packet until the packet is decoded correctly by a receiver (e.g., a UE) or some other termination condition is encountered. For synchronous HARQ, all transmissions of the packet may be sent in subframes of a single interlace. For asynchronous HARQ, each transmission of the packet may be sent in any subframe.

A UE may be located within the coverage of multiple BSs. One of these BSs may be selected to serve the UE. The serving BS may be selected based at least in part on various criteria such as received signal strength, received signal quality, path loss, and/or the like. Received signal quality may be quantified by a signal-to-noise-and-interference ratio (SINR), or a reference signal received quality (RSRQ), or some other metric. The UE may operate in a dominant interference scenario in which the UE may observe high interference from one or more interfering BSs.

While aspects of the examples described herein may be associated with LTE technologies, aspects of the present disclosure may be applicable with other wireless communication systems, such as NR or 5G technologies.

New radio (NR) may refer to radios configured to operate according to a new air interface (e.g., other than Orthogonal Frequency Divisional Multiple Access (OFDMA)-based air interfaces) or fixed transport layer (e.g., other than Internet Protocol (IP)). In aspects, NR may utilize OFDM with a CP (herein referred to as cyclic prefix OFDM or CP-OFDM) and/or SC-FDM on the uplink, may utilize CP-OFDM on the downlink and include support for half-duplex operation using time division duplexing (TDD). In aspects, NR may, for example, utilize OFDM with a CP (herein referred to as CP-OFDM) and/or discrete Fourier transform spread orthogonal frequency-division multiplexing (DFT-s-OFDM) on the uplink, may utilize CP-OFDM on the downlink and include support for half-duplex operation using TDD. NR may include Enhanced Mobile Broadband (eMBB) service targeting wide bandwidth (e.g., 80 megahertz (MHz) and beyond), millimeter wave (mmW) targeting high carrier frequency (e.g., 60 gigahertz (GHz)), massive MTC (mMTC) targeting non-backward compatible MTC techniques, and/or mission critical targeting ultra reliable low latency communications (URLLC) service.

A single component carrier bandwidth of 100 MHZ may be supported. NR resource blocks may span 12 sub-carriers with a sub-carrier bandwidth of 75 kilohertz (kHz) over a 0.1 ms duration. Each radio frame may include 50 subframes with a length of 10 ms. Consequently, each subframe may have a length of 0.2 ms. Each subframe may indicate a link direction (e.g., DL or UL) for data transmission and the link direction for each subframe may be dynamically switched. Each subframe may include downlink/uplink (DL/UL) data as well as DL/UL control data.

Beamforming may be supported and beam direction may be dynamically configured. MIMO transmissions with precoding may also be supported. MIMO configurations in the DL may support up to 8 transmit antennas with multi-layer DL transmissions up to 8 streams and up to 2 streams per UE. Multi-layer transmissions with up to 2 streams per UE may be supported. Aggregation of multiple cells may be supported with up to 8 serving cells. Alternatively, NR may support a different air interface, other than an OFDM-based interface. NR networks may include entities such central units or distributed units.

The RAN may include a central unit (CU) and distributed units (DUs). A NR BS (e.g., gNB, 5G Node B, Node B, transmit receive point (TRP), access point (AP)) may correspond to one or multiple BSs. NR cells can be configured as access cells (ACells) or data only cells (DCells). For example, the RAN (e.g., a central unit or distributed unit) can configure the cells. DCells may be cells used for carrier aggregation or dual connectivity, but not used for initial access, cell selection/reselection, or handover. In some cases, DCells may not transmit synchronization signals. In some cases, DCells may transmit synchronization signals. NR BSs may transmit downlink signals to UEs indicating the cell type. Based at least in part on the cell type indication, the UE may communicate with the NR BS. For example, the UE may determine NR BSs to consider for cell selection, access, handover, and/or measurement based at least in part on the indicated cell type.

As indicated above, FIG. 4 is provided merely as an example. Other examples are possible and may differ from what was described with regard to FIG. 4.

Figure 5B:
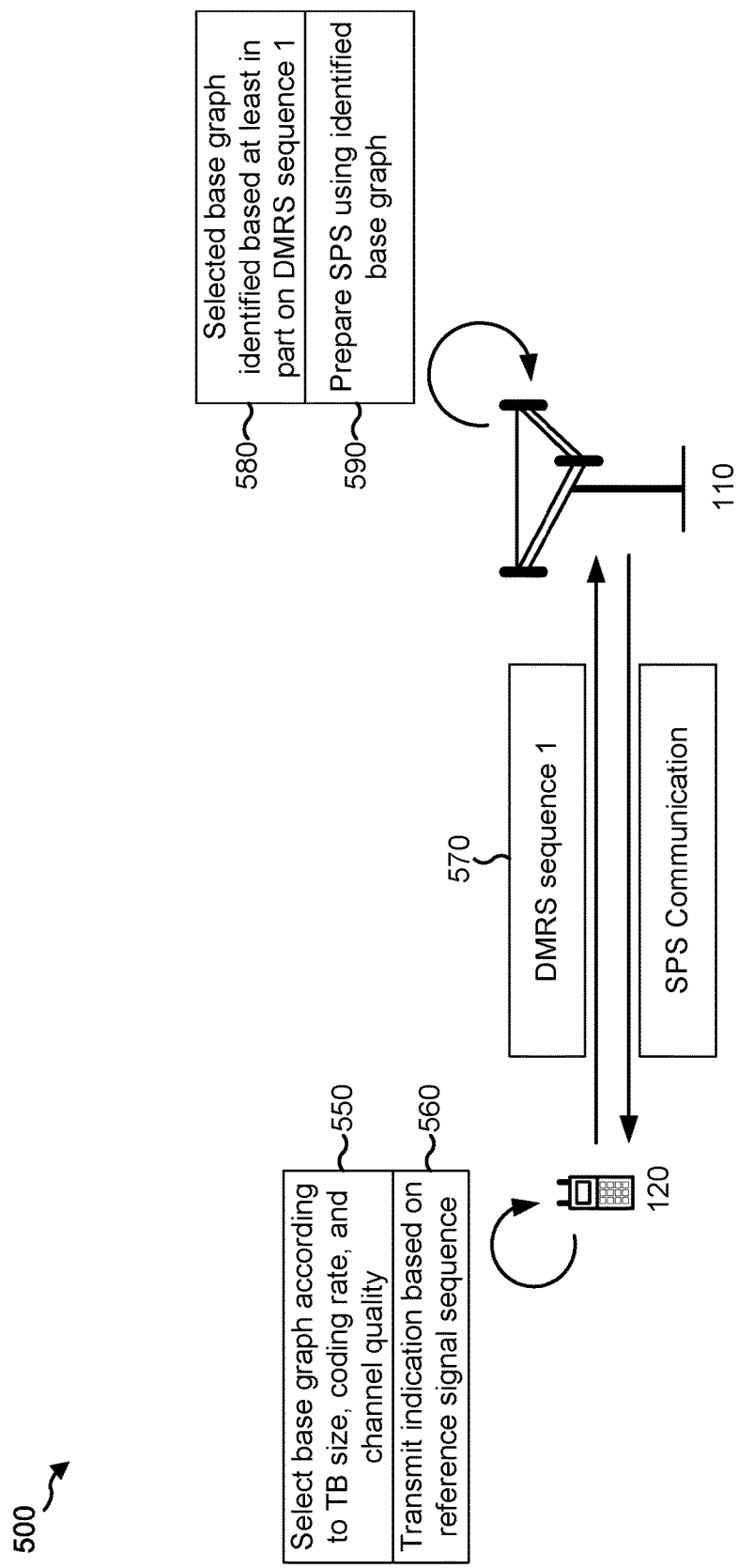

FIGS. 5A and 5B are diagrams illustrating examples 500 of LDPC base graph determination and indication, in accordance with various aspects of the present disclosure.

FIG. 5A shows an example of explicit indication of an LDPC base graph to be used for decoding of communications. As shown in FIG. 5A, and by reference number 510, a BS 110 may provide downlink control information (DCI) to a UE 120. As further shown, the DCI may include a bit value that indicates to use a second base graph (e.g., base graph 2). For example, the bit, when set to a first value, may indicate to use a first base graph, and may indicate to use a second base graph when set to a second value. By providing an explicit indicator of which base graph is to be used in the DCI, implementation of the indicator may be simplified. Furthermore, the DCI may be robust against a grant erasure event (e.g., wherein a grant indicating which base graph to use is not received or is lost in transmission).

In some aspects, the BS 110 may use radio resource control (RRC) information to provide the indicator. For example, the BS 110 may perform RRC configuration of the UE 120 to use one base graph or another base graph. As a more particular example, for a UE 120 associated with a high-geometry environment (e.g., an environment with many interferers and/or geometric features), the BS 110 may RRC configure the UE 120 to use a base graph associated with a higher code block size and/or code rate, and for a UE 120 associated with a low-geometry environment, the BS 110 may RRC configure the UE 120 to use a base graph associated with a lower code block size and/or code rate. In this way, performance of UEs may be improved based at least in part on an environment in which the UEs are deployed. Furthermore, by using RRC configuration, the BS 110 may save one or more bits of DCI that would otherwise be used to indicate the base graph in the DCI. This may be particularly advantageous when a first base graph is used more often than a second base graph, since the one or more bits may typically be set to a same value in such a case.

As shown by reference number 520, the UE 120 may receive the DCI. As further shown, the UE 120 may determine that the DCI indicates to use the second base graph for a communication from the BS 110. As shown by reference number 530, the UE 120 may receive the communication from the BS 110. As shown by reference number 540, the UE 120 may decode the communication using the second base graph. In this way, a base graph for decoding of a communication is explicitly signaled using RRC configuration or DCI by a BS 110.

FIG. 5B is an example relating to configuration of a semi-persistent scheduling (SPS) or grant-free communication, wherein a UE 120 indicates a selected base graph using a reference signal sequence. While the operations described in connection with FIG. 5B are described with regard to SPS communications, these operations are equally applicable with regard to grant-free communications.

As shown in FIG. 5B, and by reference number 550, the UE 120 may select a base graph for an SPS transmission based at least in part on a transport block (TB) size of the communication (e.g., a transport block), a coding rate of the communication, and/or a channel quality associated with the communication. In some aspects, the communication may include and/or may be a transport block (e.g., having a transport block size). For example, the UE 120 may determine whether a base graph associated with a larger transport block size and/or coding rate should be used, or whether a base graph associated with a smaller transport block size and/or coding rate should be used.

As shown by reference number 560, the UE 120 may transmit an indication of which base graph is to be used based at least in part on a reference signal sequence. For example, the UE 120 may transmit a first reference signal sequence when a first base graph is to be used, and may transmit a second reference signal sequence when a second base graph is to be used. In some aspects, the reference symbol sequence may include a demodulation reference symbol (DMRS) sequence, a channel state information reference signal (CSI-RS), and/or the like. As shown by reference number 570, the UE 120 may transmit a DMRS sequence 1, which may correspond to a selected base graph.

As shown by reference number 580, the BS 110 may identify the selected base graph based at least in part on receiving DMRS sequence 1 from the UE 120. As shown by reference number 590, the BS 110 may prepare SPS communications using the selected base graph associated with DMRS sequence 1. For example, the BS 110 may encode and transmit SPS communications based at least in part on the selected base graph. In this way, the UE 120 can indicate a selected base graph for an SPS or grant-free communication based at least in part on transport block size, coding rate, and/or channel quality at the UE 120, and may indicate the selected base graph based at least in part on a reference signal sequence.

In some aspects, the BS 110 may determine a base graph for an SPS or grant-free communication. For example, the BS 110 may determine the base graph based at least in part on an indication received from the UE 120. In some aspects, the BS 110 may determine the base graph based at least in part on a resource allocation of the SPS or grant-free communication. For example, when the resource allocation is smaller than a particular threshold, the BS 110 may identify a base graph associated with a smaller code block size and/or a lower coding rate. In other words, a condition for selection of the base graph for an SPS or grant-free communication may be different than a condition for selection of the base graph for a communication associated with a grant.

In some aspects, a communication may include multiple, different codewords. For example, the communication may be associated with a rank greater than or equal to 2. In such a case, the indication or configuration of the base graph can be shared between the multiple, different codewords (e.g., a single base graph indication or configuration for all of the multiple, different codewords), or can be independent for each codeword of the multiple, different codewords.

As indicated above, FIGS. 5A and 5B are provided as examples. Other examples are possible and may differ from what was described with respect to FIGS. 5A and 5B.

Figure 6:
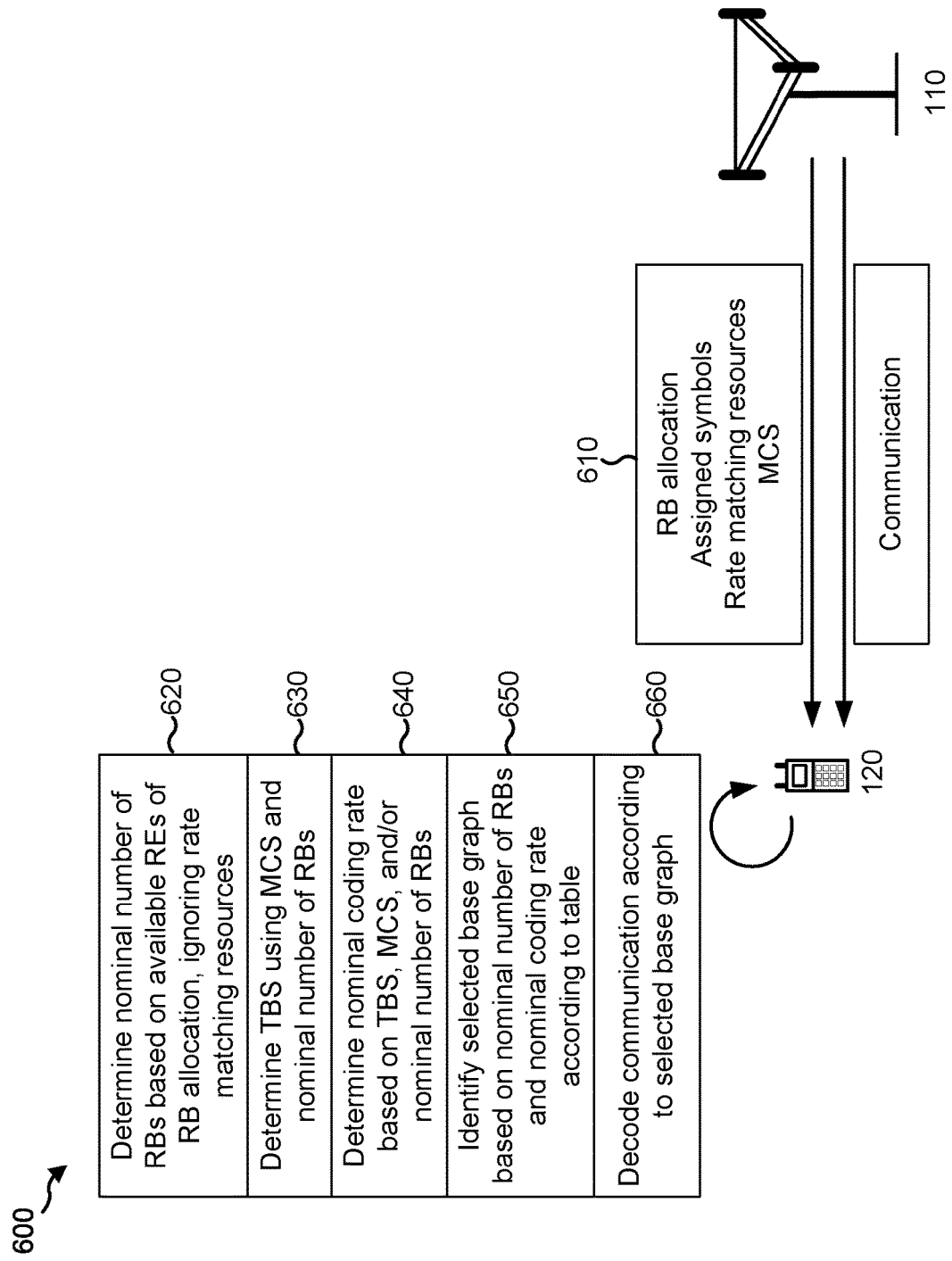
FIG. 6 is a diagram illustrating an example of LDPC base graph determination and indication, in accordance with various aspects of the present disclosure.

FIG. 6 is a diagram illustrating an example 600 of LDPC base graph determination and indication, in accordance with various aspects of the present disclosure. FIG. 6 is an example in which a receiving or decoding device (e.g., a UE 120 or a BS 110) identifies a base graph based at least in part on a nominal number of resources (e.g., RBs) and a nominal coding rate that are determined by the receiving or decoding device. FIG. 6 is described from the perspective of a UE 120 as a receiving or decoding device, but the operations described in connection with FIG. 6 are equally applicable when the receiving or decoding device is a BS 110.

As shown in FIG. 6, and by reference number 610, a BS 110 may provide a resource block (RB) allocation for a communication, one or more symbols that are assigned for the communication, one or more rate matching resources of the RB allocation, and/or an MCS of the communication. In some aspects, the MCS may be identified in a DCI or a similar communication. Additionally, or alternatively, for uplink communications in which the UE 120 can select an MCS (e.g., SPS communications), the BS 110 may configure the UE 120 with one or more available MCSs, and the UE 120 may select an available MCS to use. In such a case, the BS 110 may know which MCS is to be used. In some aspects, the RB allocation may be identified in the DCI and/or the like.

As shown by reference number 620, the UE 120 may determine a nominal number of resources (e.g., RBs) for the communication based at least in part on available REs of the RB allocation of the communication. For example, the UE 120 may determine the nominal number of resources (e.g., RBs) based at least in part on an RB allocation of the UE 120, and based at least in part on a set of symbols assigned for the communication. For example, the set of symbols may be identified in the grant, in the DCI for the UE 120, and/or in an RRC configuration message for the UE 120. In some aspects, the set of symbols may be identified based at least in part on a starting and ending symbol assigned for the communication, a dynamic starting and/or ending symbol of the communication, a mini-slot based communication, a slot-bundling communication, and/or the like.

As further shown, in some aspects, the UE 120 may ignore at least part of the one or more rate matching resources. In some aspects, the UE 120 may ignore a portion of the one or more rate matching resources. In some aspects, the UE 120 may ignore all of the rate matching resources. This may improve speed and/or computational performance of determination of the nominal number of resources (e.g., RBs). The one or more rate matching resources may include, for example, a CSI-RS, a DMRS, a non-reusable control resource, a reserved resource, and/or the like.

To determine the nominal number of resources (e.g., RBs), the UE 120 may determine a number of REs available for or assigned for a communication, and may convert the number of REs to a nominal number of resources. For example, the UE 120 may assume that a particular number of REs are included in each nominal RB (e.g., 144 REs, 12×12 REs, or a different number), and may divide the number of REs available by the particular number of REs to determine the nominal number of resources.

As shown by reference number 630, the UE 120 may determine a transport block size (TBS) for the communication. The TBS may permit the UE 120 to determine a nominal coding rate for the communication, as described in more detail below. In some aspects, the UE 120 may determine the TBS based at least in part on an MCS of the communication, the nominal number of resources, and/or a rank of the communication. For example, the UE 120 may determine the TBS by reference to a lookup table that identifies a TBS corresponding to the MCS, the nominal number of resources, and the rank of the communication.

As shown by reference number 640, the UE 120 may determine a nominal coding rate of the communication. The nominal coding rate may be used in connection with the TBS and/or the nominal number of resources (e.g., RBs) to determine which base graph should be used, as described in more detail below and in connection with FIGS. 7A and 7B. The UE 120 may determine the nominal coding rate since an actual coding rate of the communication may differ from what is granted in the resources.

In some aspects, the UE 120 may determine the nominal coding rate that corresponds to an MCS identified by the grant. For example, each MCS is associated with a corresponding coding rate. The UE 120 may identify the corresponding coding rate as the nominal coding rate.

In some aspects, the UE 120 may determine the nominal coding rate by modifying the TBS. For example, the UE 120 may divide the TBS by a size of a nominal resource block (e.g., 144 REs and/or the like), a modulation order of the MCS, and/or a rank of the communication. In this way, a nominal coding rate may be determine for each entry in the table used to determine the TBS.

As another example of the sequence described above for determining the nominal coding rate and the nominal number of resources (e.g., RBs), a receiving device may first determine a resource allocation from a grant for a communication. Second, the receiving device may translate the resource allocation to a nominal number of resources for the communication. Third, the receiving device may use the nominal number of resources and an MCS of the communication (identified in the grant for the communication), as well as a rank of the communication, to look up a TBS of the communication. The TBS indicates a number of information bits of the communication. The receiving device may multiply the nominal number of resources and a nominal RB size to compute a nominal number of REs. The receiving device may multiply the nominal number of REs by a modulation order and rank of the communication to determine a nominal number of coded bits. The receiving device may determine a ratio of the number of information bits and the nominal number of coded bits to determine the nominal coding rate.

As shown by reference number 650, the UE 120 may identify or determine a selected base graph based at least in part on the nominal number of resources and the nominal coding rate according to a table. The table may include the table described in connection with FIG. 7A, the table described in connection with FIG. 7B, and/or the like. To determine the selected base graph, the UE 120 may identify a value of the table corresponding to the nominal number of resources and the nominal coding rate, and may determine whether the value indicates to use a first base graph or a second base graph to identify the selected base graph. As shown by reference number 660, the UE 120 may decode the communication according to the selected base graph. In this way, the UE 120 identifies a selected base graph for decoding of the communication based at least in part on information received or determined by the UE 120, which conserves signaling resources that would otherwise be used to explicitly indicate the selected base graph.

As indicated above, FIG. 6 is provided as an example. Other examples are possible and may differ from what was described with respect to FIG. 6.

Figure 7A:
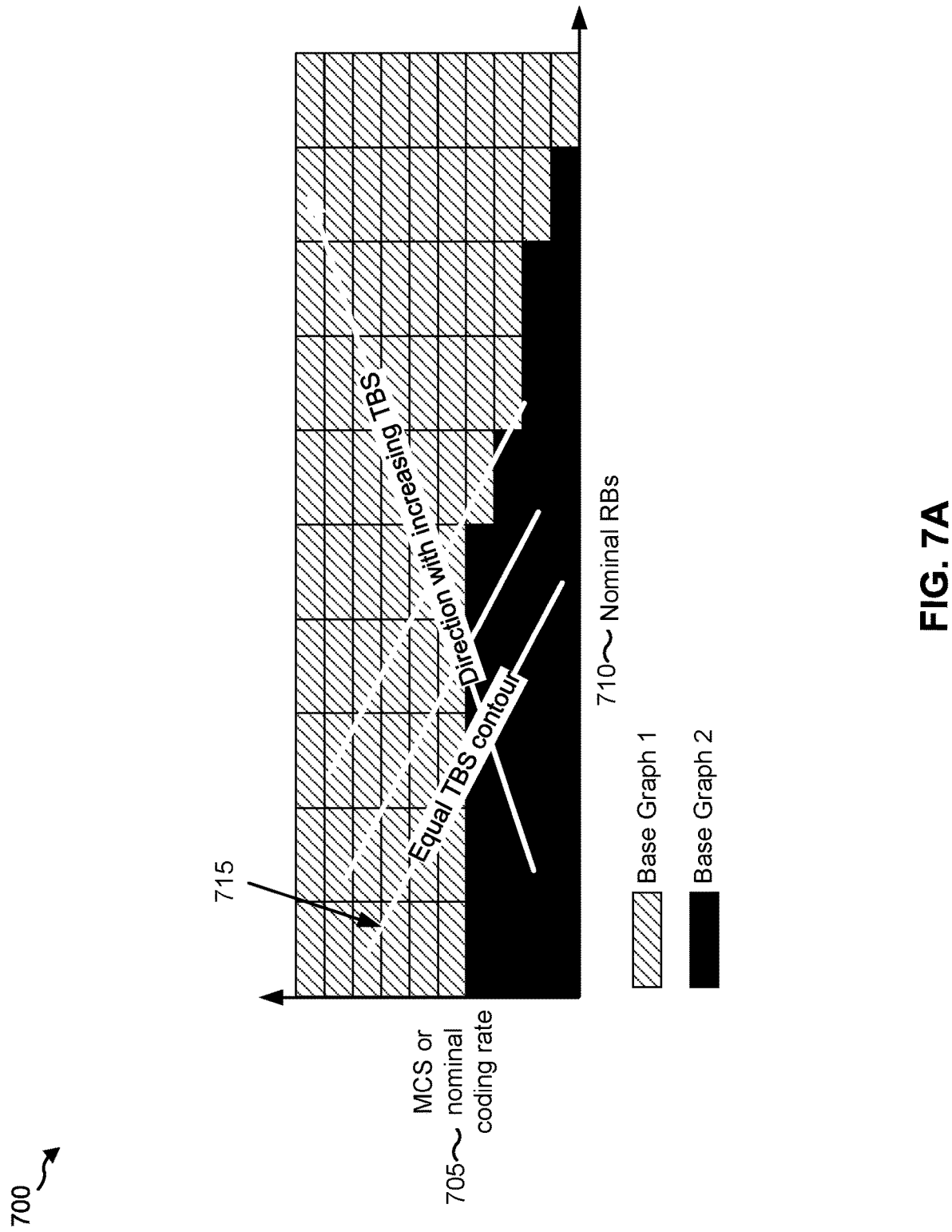
FIGS. 7A and 7B are diagrams illustrating examples of tables used for LDPC base graph determination, in accordance with various aspects of the present disclosure.
Figure 7B:
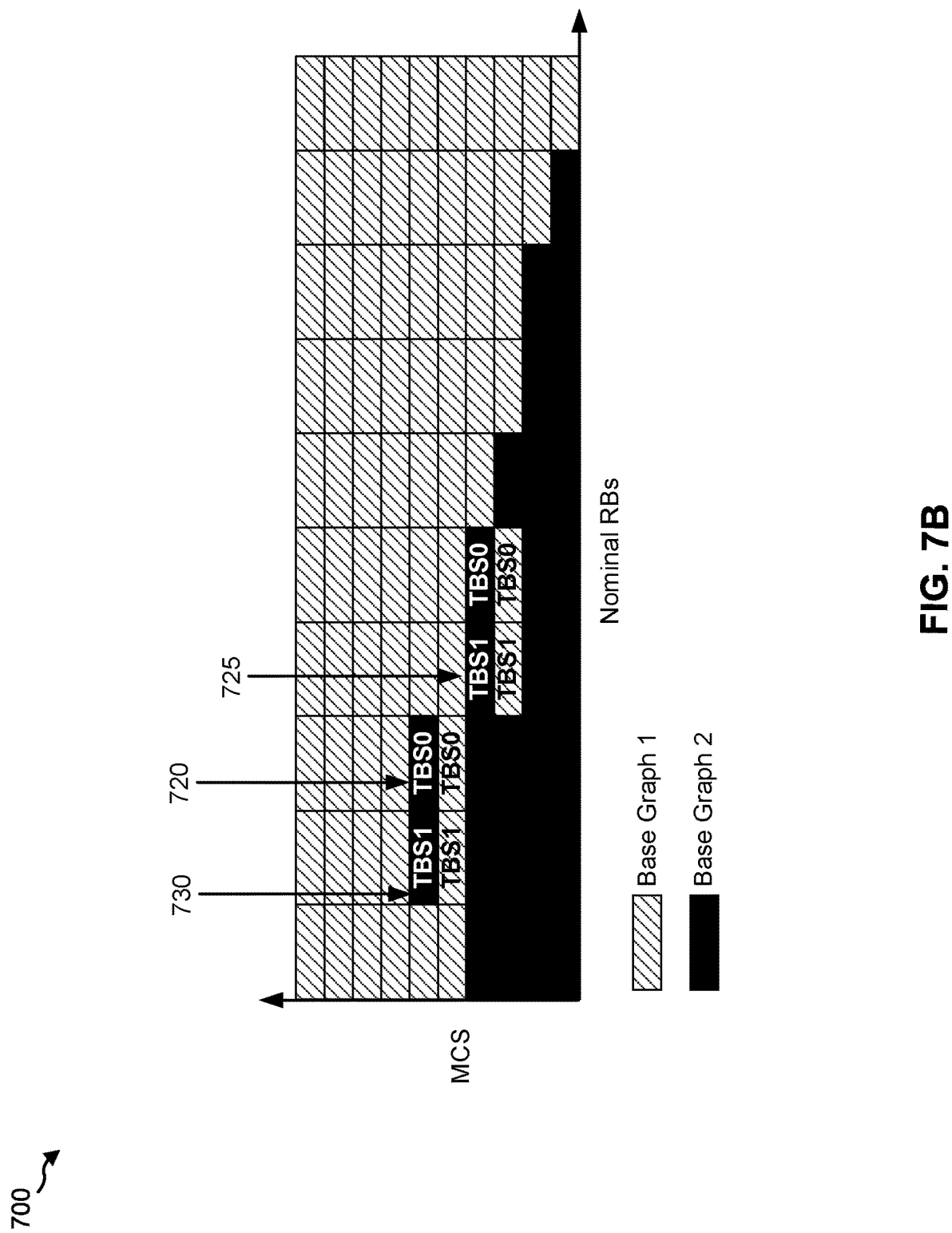

FIGS. 7A and 7B are diagrams illustrating examples 700 of tables used for LDPC base graph determination, in accordance with various aspects of the present disclosure.

As shown in FIG. 7A, and by reference number 705, a first axis of the table may correspond to increasing MCS or nominal coding rate of a communication. As shown by reference number 710, a second axis of the table may correspond to an increasing nominal number of resources (e.g., RBs) of the communication. The UE 120 may identify the MCS or nominal coding rate of a communication, as well as the nominal number of resources of the communication, and may identify a corresponding table entry. When the corresponding table entry indicates to use a first base graph (shown in FIG. 7A using diagonal fill), the UE 120 may determine that the first base graph is to be used. When the corresponding table entry indicates to use a second base graph (shown in FIG. 7A using solid fill), the UE 120 may determine that the second base graph is to be used. In this way, the UE 120 determines which base graph is to be used based at least in part on a particular table.

As shown by reference number 715, some entries of the table may have equal TBS values. For example, the diagonal lines labelled "Equal TBS contour" may indicate MCS or nominal coding rate values, and corresponding nominal RB values that are associated with equal TBS. The equal TBS for different MCS, nominal coding rate, and/or nominal RB values may be problematic in the case of a first transmission and a retransmission of a communication, when the first transmission and the retransmission are associated with the same TBS. For example, the table shown in FIG. 7A may indicate that a first base graph is to be used for a first transmission and a second base graph is to be used for a retransmission based at least in part on differences between MCS, nominal coding rate, and/or nominal number of resources of the first transmission and the retransmission. Below, various techniques for resolving ambiguity in base graph selection for communications are described.

FIG. 7B is an example of a table used to resolve ambiguity in base graph selection for a first transmission and a retransmission of a communication. As shown by reference number 720, when a TBS is supported for two base graphs, two entries may be defined for the TBS. The two entries may have the same nominal number of resources (e.g., RBs), and may have different MCS or nominal coding rate values. When a transmitting device determines a base graph for a retransmission that is associated with a different nominal number of resources than a first transmission, the transmitting device can modify the MCS so that a table value corresponding to the same base graph as the first transmission is indicated for the retransmission.

As an example, assume that a first transmission is associated with a nominal coding rate and a nominal number of resources that correspond to the table entry shown by reference number 725. Assume further that a retransmission of the first transmission (associated with the same TBS) is to be transmitted with a smaller nominal number of resources. In this case, if the table shown in FIG. 7A were used, base graph 1 would be used for the retransmission, thereby causing failed decoding of the retransmission and/or failed soft combining of the first transmission and the retransmission. By using the table shown in FIG. 7B, the transmitting entity can select a number of nominal RBs and an MCS or nominal coding rate corresponding to the table value shown by reference number 730. This, in turn, leads to usage of the same base graph for both transmissions, thereby improving likelihood of successful reception and decoding of the retransmission.

In this way, by sacrificing some granularity in the MCS dimension, retransmission of a same TBS with a significantly different nominal number of resources is supported. When a TBS is supported in both base graphs, in the same column (for nominal number of resources), two table entries may be defined with the same TBS and different MCS values. The transmitting entity (e.g., BS, UE, eNB, gNB, etc.) can select one of the table entries by changing an MCS of the retransmission so that a same base graph is used for both an initial transmission and a retransmission. This may be particularly helpful for a base graph that is associated with a small TBS, so this particular modification to the table needs only be performed for a relatively small number of table entries.

Various other techniques for handling transmissions and retransmissions that can potentially have different base graph values are described in turn below.

In one aspect, a transmitting device may ensure that a retransmission uses the same base graph as a transmission. For example, the transmitting device may ensure that a MCS, nominal coding rate, and/or nominal number of resources are selected that will not lead to identification of a different base graph for a first transmission and a retransmission. This may lead to simpler implementation on the receiver side, but may constrict flexibility on the transmitting device side.

In one aspect, the table for selecting a base graph (e.g., the table shown in FIG. 7A) may be defined such that no TBS is shared between the first base graph (shown by the diagonal fill) and the second base graph (shown by the solid fill). This can be achieved by adjusting the TBS entries of the table. This may lead to simpler implementation on the receiver side, but may constrict flexibility on the transmitting device side.

In one aspect, when a TBS may potentially be associated with two different base graphs, a receiving device may attempt to decode a communication of the TBS using both of the two different base graphs. Presumably, one of the attempts will succeed, and the receiving device will successfully decode the communication. In the case where there are multiple retransmissions, the receiving device may combine different hypotheses to determine one or more base graphs to use to decode the multiple retransmissions. Once the receiving device has identified a base graph that successfully decodes a transmission, the receiving device may use that base graph for subsequent retransmissions, thereby conserving resources that would otherwise be used to select a base graph for the subsequent retransmissions.

Additionally, or alternatively, the receiving device may use one or more metrics (e.g., decoder metrics and/or the like) to determine whether a particular base graph was used for a communication, which may conserve resources of the receiving device that would otherwise be used to attempt decoding using multiple different base graphs. This technique can be used on the downlink, wherein the receiving device is a UE 120, or on the uplink (e.g., for SPS communication) where the receiving device is a BS 110. In this case, a TBS can be used with two or more base graphs, thereby improving flexibility of the LDPC process.

In one aspect, a redundancy version indicator (RVID) of a retransmission may indicate which base graph should be used for the retransmission. For example, when the RVID of a retransmission is set to a particular value (e.g., 0), a receiving device may determine that the retransmission must be associated with the same base graph as an initial transmission, and may abandon attempts to decode the retransmission using a different base graph. In this way, resources are conserved that would otherwise be used to attempt decoding of the retransmission using the different base graph.

In one aspect, the receiving device may assume a particular base graph is to be used for decoding when a code block size of a communication is below a particular threshold, and when there is uncertainty in a coding rate of the communication. For example, when the coding rate is uncertain (e.g., when a coding rate is close to a cutoff between two nominal coding rates, or when the receiving device does not have sufficient information to determine the coding rate based at least in part on the transmission being an initial transmission), the receiving device may use a particular base graph to attempt decoding of the communication. For example, the particular base graph may include a default base graph, a most likely base graph according to the table shown in FIG. 7A, and/or the like.

If decoding fails using the particular base graph, the receiving device may provide an indication of the particular base graph. For example, the receiving device may provide the indication in a negative acknowledgment for the communication. The indication may include, for example, an explicit payload in an uplink control channel (e.g., PUCCH), a particular scrambling or DMRS sequence corresponding to the particular base graph, and/or the like. In some aspects, the transmitting device may use the indication to determine that a different base graph should be used. Additionally, or alternatively, the transmitting device may use the indication to determine that information identifying a correct base graph should be provided to the receiving device. In some aspects, this technique can be used on the downlink, wherein the transmitting device is a UE 120 and the negative acknowledgment is transmitted by the BS 110. For example, this technique may be used in the case of an uplink SPS transmission wherein the UE 120 chooses the MCS of the uplink SPS transmission.

The techniques described in connection with FIGS. 5A, 5B, 6, 7A, and 7B may be applied for single codewords or for groups of multiple codewords. For example, the techniques described above can be separately applied for each codeword of a group of multiple codewords. Additionally, or alternatively, the techniques described above can be applied for all codewords of a group of multiple codewords.

In some aspects, for a broadcast communication (e.g., a downlink control channel message scrambled according to a broadcast radio network temporary identifier (RNTI), a paging RNTI, a RAR-RNTI, or a Msg3 RNTI), the transmitting device may use a particular base graph. For example, the transmitting device may use a base graph associated with a small coding rate and/or code block size. This may be particularly helpful when the broadcast communication is small, as may be typical of broadcast communications. This may avoid ambiguity in base graph for broadcast messages.

As indicated above, FIGS. 7A and 7B are provided as examples. Other examples are possible and may differ from what was described with respect to FIGS. 7A and 7B.

Figure 8:
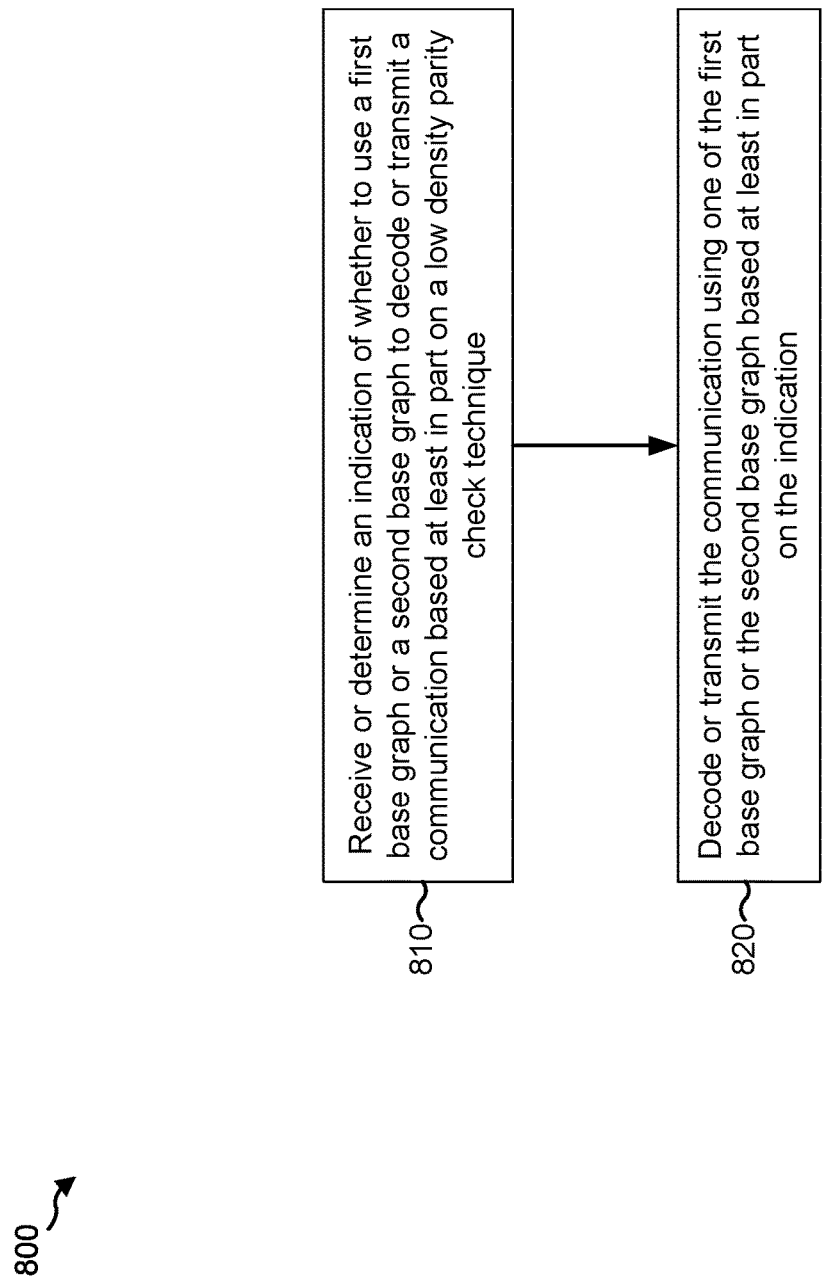
FIG. 8 is a diagram illustrating an example process performed, for example, by a user equipment or base station, in accordance with various aspects of the present disclosure.

FIG. 8 is a diagram illustrating an example process 800 performed, for example, by a device such as a UE or BS, in accordance with various aspects of the present disclosure. Example process 800 is an example where a device (e.g., UE 120 or BS 110) performs LDPC base graph determination and indication.

As shown in FIG. 8, in some aspects, process 800 may include receiving or determining an indication of whether to use a first base graph or a second base graph to decode or transmit a communication based at least in part on a low density parity check (LDPC) technique (block 810). For example, the device may receive an indication of whether to use a first base graph or a second base graph to decode or transmit a communication. In such a case, the indication may be an explicit indication. In some aspects, the device may determine an indication of whether to use the first base graph or the second base graph. For example, the device may determine the indication based at least in part on received or granted information regarding the communication.

As shown in FIG. 8, in some aspects, process 800 may include decoding or transmitting the communication using one of the first base graph or the second base graph based at least in part on the indication (block 820). For example, the device may decode the transmission (when the device is a receiving device) or transmit the communication (when the device is a transmitting device) using one of the first base graph or the second base graph. For a more detailed description of selection and/or decoding using base graphs, refer to FIGS. 5A-7B, above.

Process 800 may include additional aspects, such as any single aspect or any combination of aspects described below and/or in connection with one or more other processes described elsewhere herein.

In some aspects, the indication is a bit in downlink control information. In some aspects, the indication is received in a radio resource control configuration message. In some aspects, the indication is received as part of a semi-persistent scheduling configuration message or a grant-free transmission configuration message. In some aspects, the indication is based at least in part on whether a first reference signal sequence or a second reference signal sequence of the semi-persistent scheduling configuration message or the grant-free transmission configuration message is used, and a scheduling entity configures the first reference signal sequence to indicate that the first base graph should be used, and the second reference signal sequence to indicate that the second base graph should be used. In some aspects, the communication includes multiple, different codewords, and the indication is for all codewords of the multiple, different codewords. In some aspects, the communication includes multiple, different codewords, and wherein the indication is one of multiple different indications, each of the multiple different indications corresponding to one codeword.

Although FIG. 8 shows example blocks of process 800, in some aspects, process 800 may include additional blocks, fewer blocks, different blocks, or differently arranged blocks than those depicted in FIG. 8. Additionally, or alternatively, two or more of the blocks of process 800 may be performed in parallel.

Figure 9:
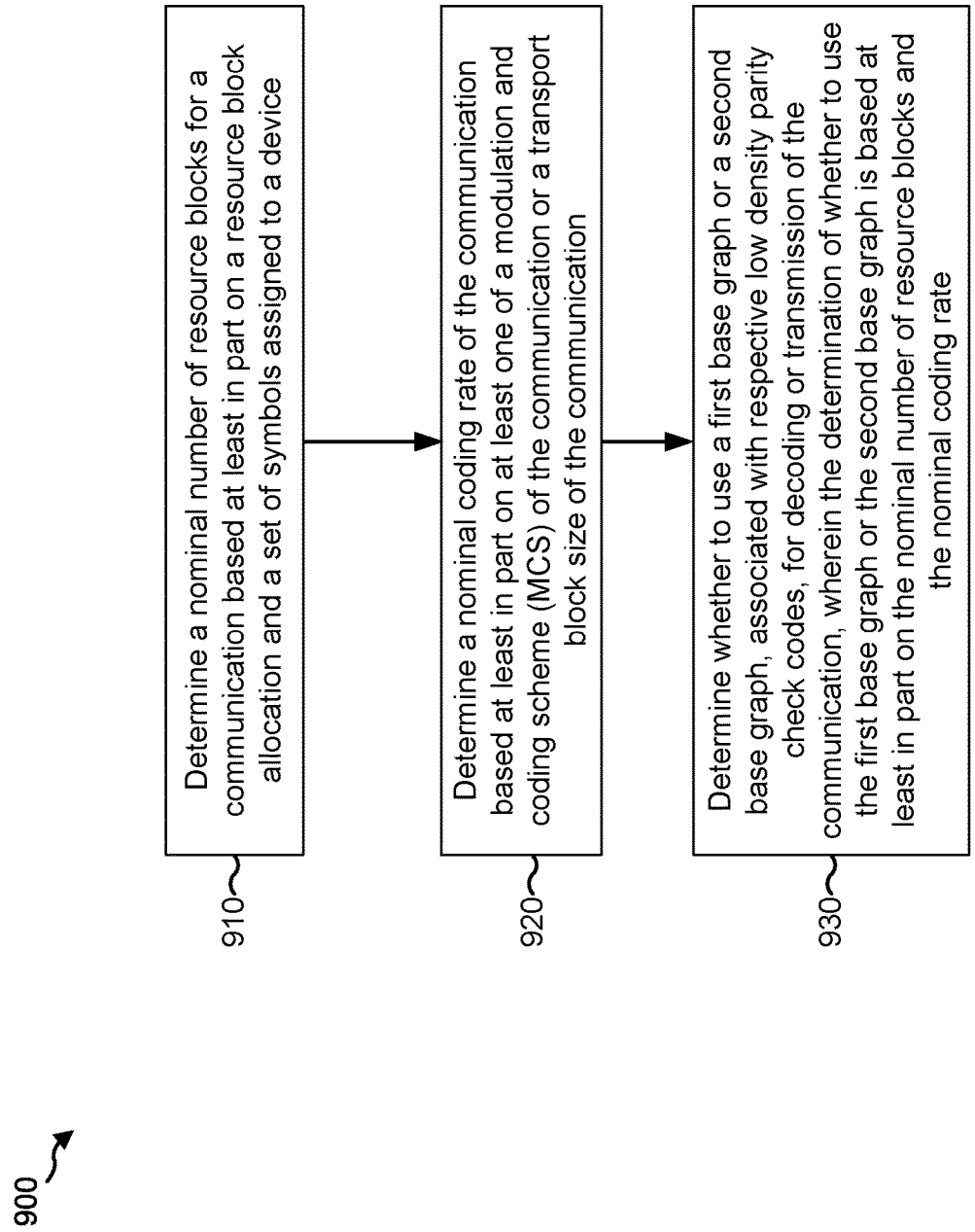
FIG. 9 is a diagram illustrating an example process performed, for example, by a user equipment or base station, in accordance with various aspects of the present disclosure.

FIG. 9 is a diagram illustrating an example process 900 performed, for example, by a device such as a UE or BS, in accordance with various aspects of the present disclosure. Example process 900 is an example where a device (e.g., UE 120 or BS 110) performs LDPC base graph determination and indication.

As shown in FIG. 9, in some aspects, process 900 may include determining a nominal number of resource blocks for a communication based at least in part on a resource block allocation and a set of symbols assigned to a device (block 910). For example, the device may determine a nominal number of resource blocks for a communication. The device may determine the nominal number of resource blocks based at least in part on a resource block allocation and a set of symbols assigned to the device for the communication, as described in more detail elsewhere herein.

As shown in FIG. 9, in some aspects, process 900 may include determining a nominal coding rate of the communication based at least in part on at least one of a modulation and coding scheme of the communication or a transport block size of the communication (block 920). For example, the device may determine a nominal coding rate of the communication. The device may determine the nominal coding rate of the communication based at least in part on at least one of a modulation and coding scheme of the communication or a transport block size of the communication, as described in more detail elsewhere herein.

As shown in FIG. 9, in some aspects, process 900 may include determining whether to use a first base graph or a second base graph, associated with respective LDPC codes, for decoding or transmission of the communication, wherein the determination of whether to use the first base graph or the second base graph is based at least in part on the nominal number of resource blocks and the nominal coding rate (block 930). For example, the device may determine whether to use a first base graph or a second base graph for decoding or transmission of the communication. The first base graph and the second base graph may be associated with respective LDPC codes. The device may determine whether to use the first base graph or the second base graph based at least in part on the nominal number of resource blocks and the nominal coding rate, as described in more detail elsewhere herein.

Process 900 may include additional aspects, such as any single aspect or any combination of aspects described below and/or in connection with one or more other processes described elsewhere herein.

In some aspects, the resource block allocation is determined based at least in part on control information of the device. In some aspects, the resource block allocation is determined based at least in part on at least one rate matching resource in the resource block allocation. In some aspects, at least a portion of the at least one rate matching resource is ignored for the determination of the nominal number of resource blocks. In some aspects, the nominal number of resource blocks is determined based at least in part on a number of available resource elements in the resource block allocation. In some aspects, the nominal coding rate is a coding rate corresponding to the MCS. In some aspects, the nominal coding rate is identified in a table that defines the transport block size. In some aspects, the determination of whether to use the first base graph or the second base graph is based at least in part on a table that maps nominal coding rates and nominal numbers of resource blocks to indications of whether to use the first base graph or the second base graph.

In some aspects, the communication is a retransmission relating to a transmission, and the transmission is associated with at least one of a different coding rate or a different nominal resource block value than the retransmission, and the transmission and the retransmission are associated with a same transport block size.

In some aspects, the retransmission is configured by a transmitting entity to use a same base graph as the transmission. In some aspects, the determination of whether to use the first base graph or the second base graph is based at least in part on a table that maps nominal numbers of resource blocks and at least one of nominal coding rates or MCSs to indications of whether to use the first base graph or the second base graph, wherein the table is designed so that table entries under the first base graph and the second base graph do not share the same transport block size. In some aspects, the determination of whether to use the first base graph or the second base graph is based at least in part on a table that maps nominal numbers of resource blocks and at least one of nominal coding rates or MCSs to indications of whether to use the first base graph or the second base graph, wherein the table is designed with table entries under different base graphs sharing at least one transport block size, and wherein, for each transport block size supported by the first base graph and the second base graph, within each base graph, there are two entries with an equal transport block size, an equal nominal number of resource blocks, and a different MCS.

In some aspects, the determination of whether to use the first base graph or the second base graph is based at least in part on a table that maps nominal resource block values and at least one of nominal coding rates or MCSs to indications of whether to use the first base graph or the second base graph, wherein the retransmission can use an entry in the table with the same transport block size, and a base graph to use for the retransmission is the same as a base graph used for the transmission irrespective of a base graph indicated by the table. The device may attempt to decode the retransmission using the first base graph and the second base graph based at least in part on a determination that the same transport block size can be associated with the first base graph and can be associated with the second base graph.

In some aspects, the device may determine that decoding is not to be attempted using a particular base graph based at least in part on a metric associated with the retransmission. In some aspects, the determination of whether to use the first base graph or the second base graph for decoding or transmitting the retransmission is based at least in part on a redundancy version indicator indicating that the transmission and the retransmission are associated with a same base graph. In some aspects, the device may determine that decoding has failed using a selected base graph of the first base graph and the second base graph; and may transmit information indicating that decoding has failed using the selected base graph.

In some aspects, the information is transmitted with a negative acknowledgment for the communication. In some aspects, the communication is associated with multiple, different codewords; and wherein the determination of whether to use the first base graph or the second base graph is performed for each codeword of the multiple, different codewords. In some aspects, a particular one of the first base graph or the second base graph is used when the communication is a broadcast communication.

Although FIG. 9 shows example blocks of process 900, in some aspects, process 900 may include additional blocks, fewer blocks, different blocks, or differently arranged blocks than those depicted in FIG. 9. Additionally, or alternatively, two or more of the blocks of process 900 may be performed in parallel.

Figure 10:
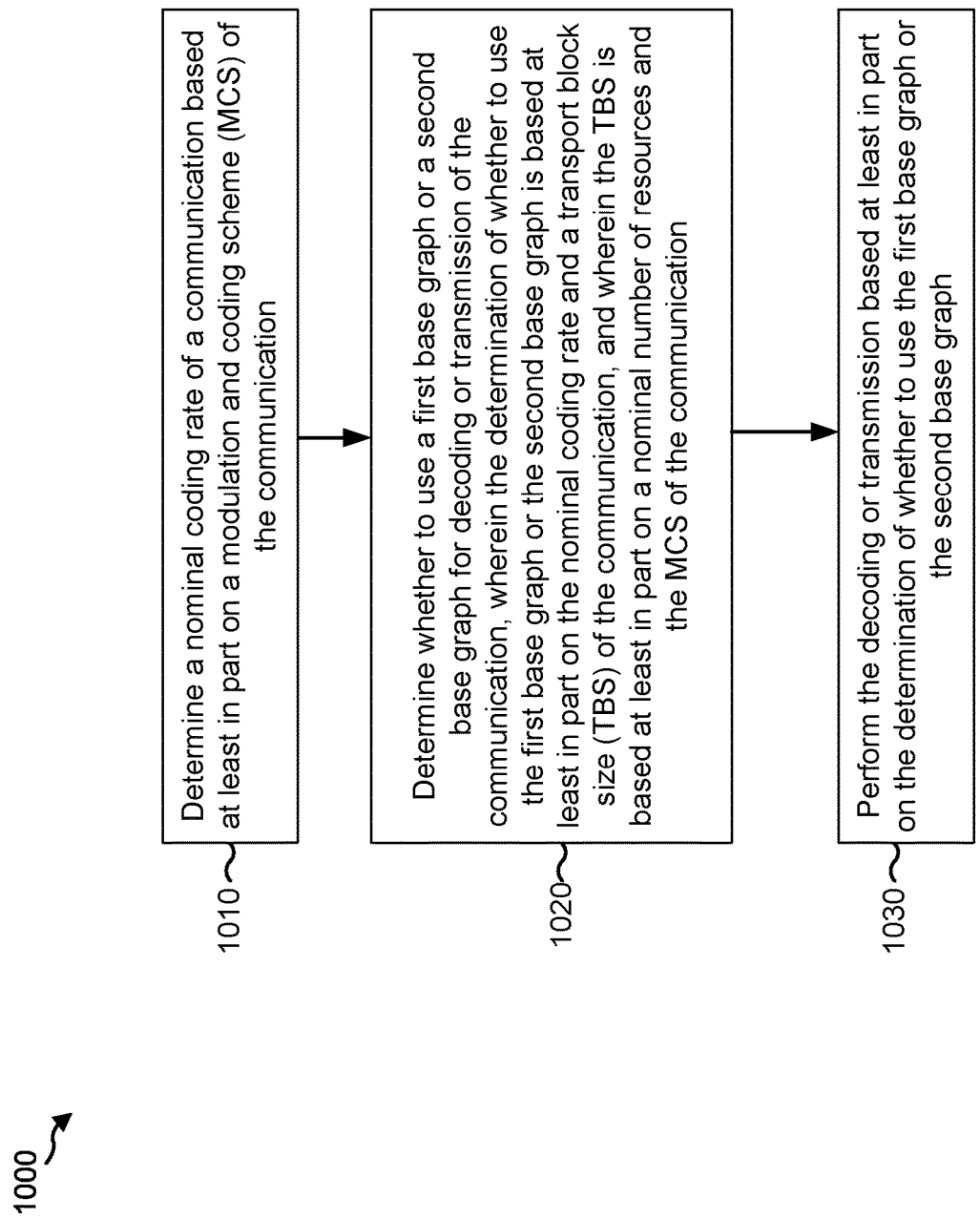
FIG. 10 is a diagram illustrating an example process performed, for example, by a user equipment or base station, in accordance with various aspects of the present disclosure.

FIG. 10 is a diagram illustrating an example process 1000 performed, for example, by a device such as a UE or BS, in accordance with various aspects of the present disclosure. Example process 1000 is an example where a device (e.g., UE 120 or BS 110) performs LDPC base graph determination and indication.

As shown in FIG. 10, in some aspects, process 1000 may include determining a nominal coding rate of a communication based at least in part on a modulation and coding scheme (MCS) of the communication (block 1010). For example, the device (e.g., using controller/processor 240, controller/processor 280, and/or the like) may determine a nominal coding rate of a communication, as described in more detail elsewhere herein. In some aspects, the nominal coding rate may be determined based at least in part on a modulation and coding scheme (MCS) of the communication.

As further shown in FIG. 10, in some aspects, process 1000 may include determining whether to use a first base graph or a second base graph for decoding or transmission of the communication, wherein the determination of whether to use the first base graph or the second base graph is based at least in part on the nominal coding rate and a transport block size (TBS) of the communication, and wherein the TBS is based at least in part on a nominal number of resources and the MCS of the communication (block 1020). For example, the device (e.g., using controller/processor 240, controller/processor 280, and/or the like) may determine whether to use a first base graph or a second base graph for decoding or transmission of the communication, as described in more detail elsewhere herein. In some aspects, the determination of whether to use the first base graph or the second base graph is based at least in part on the nominal coding rate and a transport block size (TBS) of the communication. In some aspects, the TBS is based at least in part on a nominal number of resources and the MCS of the communication. In some aspects, the first base graph and the second base graph may be associated with respective low density parity check codes.

As further shown in FIG. 10, in some aspects, process 1000 may include performing the decoding or transmission based at least in part on the determination of whether to use the first base graph or the second base graph (block 1030). For example, the device (e.g., using antenna 252, DEMOD 254, MIMO detector 256, receive processor 258, controller/processor 280, antenna 234, DEMOD 232, MIMO detector 236, receive processor 238, controller/processor 240, transmit processor 264, TX MIMO processor 266, MOD 254, transmit processor 220, TX MIMO processor 230, MOD 232, and/or the like) may transmit performing the decoding or transmission based at least in part on the determination of whether to use the first base graph or the second base graph, as described in more detail elsewhere herein.

Process 1000 may include additional aspects, such as any single aspect or any combination of aspects described below and/or in connection with one or more other processes described elsewhere herein.

In some aspects, the TBS is determined based at least in part on control information of the device. In some aspects, the TBS is determined based at least in part on at least one rate matching resource in the communication. In some aspects, the TBS is determined based at least in part on a number of available resource elements in the communication. In some aspects, the nominal coding rate is a coding rate corresponding to the MCS.

In some aspects, the communication is a retransmission relating to a transmission. In some aspects, the transmission is associated with at least one of a different coding rate or a different nominal resource block value than the retransmission. In some aspects, the transmission and the retransmission are associated with a same transport block size. In some aspects, the retransmission is configured by a transmitting entity to use a same base graph as the transmission. In some aspects, the communication is associated with multiple, different codewords; and the determination of whether to use the first base graph or the second base graph is performed for each codeword of the multiple, different codewords.

Although FIG. 10 shows example blocks of process 1000, in some aspects, process 1000 may include additional blocks, fewer blocks, different blocks, or differently arranged blocks than those depicted in FIG. 10. Additionally, or alternatively, two or more of the blocks of process 1000 may be performed in parallel.

The foregoing disclosure provides illustration and description, but is not intended to be exhaustive or to limit the aspects to the precise form disclosed. Modifications and variations are possible in light of the above disclosure or may be acquired from practice of the aspects.

As used herein, the term component is intended to be broadly construed as hardware, firmware, or a combination of hardware and software. As used herein, a processor is implemented in hardware, firmware, or a combination of hardware and software.

Some aspects are described herein in connection with thresholds. As used herein, satisfying a threshold may refer to a value being greater than the threshold, greater than or equal to the threshold, less than the threshold, less than or equal to the threshold, equal to the threshold, not equal to the threshold, and/or the like.

It will be apparent that systems and/or methods, described herein, may be implemented in different forms of hardware, firmware, or a combination of hardware and software. The actual specialized control hardware or software code used to implement these systems and/or methods is not limiting of the aspects. Thus, the operation and behavior of the systems and/or methods were described herein without reference to specific software code—it being understood that software and hardware can be designed to implement the systems and/or methods based, at least in part, on the description herein.

Even though particular combinations of features are recited in the claims and/or disclosed in the specification, these combinations are not intended to limit the disclosure of possible aspects. In fact, many of these features may be combined in ways not specifically recited in the claims and/or disclosed in the specification. Although each dependent claim listed below may directly depend on only one claim, the disclosure of possible aspects includes each dependent claim in combination with every other claim in the claim set. A phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

No element, act, or instruction used herein should be construed as critical or essential unless explicitly described as such. Also, as used herein, the articles "a" and "an" are intended to include one or more items, and may be used interchangeably with "one or more." Furthermore, as used herein, the terms "set" and "group" are intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," and/or the like are intended to be open-ended terms. Further, the phrase "based on" is intended to mean "based, at least in part, on" unless explicitly stated otherwise.

What is claimed is:

1. A method of wireless communication performed by a device, comprising:
    determining a nominal coding rate of a communication based at least in part on a modulation and coding scheme (MCS) of the communication;
    determining whether to use a first base graph or a second base graph for decoding or transmission of the communication, wherein the determination of whether to use the first base graph or the second base graph is based at least in part on:
        whether both the nominal coding rate satisfies a first coding rate threshold and a transport block size (TBS) of the communication satisfies a first TBS threshold,
        whether the nominal coding rate satisfies a second coding rate threshold different than the first coding rate threshold, and
        whether the TBS satisfies a second TBS threshold different than the first TBS threshold,
            wherein the TBS is based at least in part on a nominal number of resources and the MCS of the communication; and
    performing the decoding or transmission based at least in part on the determination of whether to use the first base graph or the second base graph.

2. The method of claim 1, wherein the TBS is determined based at least in part on control information of the device.

3. The method of claim 1, wherein the TBS is determined based at least in part on at least one rate matching resource in the communication.

4. The method of claim 1, wherein the TBS is determined based at least in part on a number of available resource elements in the communication.

5. The method of claim 1, wherein the nominal coding rate is a coding rate corresponding to the MCS.

6. The method of claim 1, wherein the communication is a retransmission relating to a transmission, and wherein the transmission is associated with at least one of a different coding rate or a different nominal resource block value than the retransmission, and wherein the transmission and the retransmission are associated with a same TBS.

7. The method of claim 6, wherein the retransmission is configured by a transmitting entity to use a same base graph as the transmission.

8. The method of claim 1, wherein the communication is associated with multiple, different codewords; and
    wherein the determination of whether to use the first base graph or the second base graph is performed for each codeword of the multiple, different codewords.

9. A device for wireless communication, comprising:
    memory;
    one or more processors coupled to the memory; and
    instructions stored in the memory and operable, when executed by the one or more processors, to cause the device to:
        determine a nominal coding rate of a communication based at least in part on a modulation and coding scheme (MCS) of the communication;
        determine whether to use a first base graph or a second base graph for decoding or transmission of the communication, wherein the determination of whether to use the first base graph or the second base graph is based at least in part on:
            whether both the nominal coding rate satisfies a first coding rate threshold and a transport block size (TBS) of the communication satisfies a first TBS threshold,
            whether the nominal coding rate satisfies a second coding rate threshold different than the first coding rate threshold, and
            whether the TBS satisfies a second TBS threshold different than the first TBS threshold,
                wherein the TBS is based at least in part on a nominal number of resources and the MCS of the communication; and
        perform the decoding or transmission based at least in part on the determination of whether to use the first base graph or the second base graph.

10. The device of claim 9, wherein the TBS is determined based at least in part on control information of the device.

11. The device of claim 9, wherein the TBS is determined based at least in part on at least one rate matching resource in the communication.

12. The device of claim 9, wherein the TBS is determined based at least in part on a number of available resource elements in the communication.

13. The device of claim 9, wherein the nominal coding rate is a coding rate corresponding to the MCS.

14. The device of claim 9, wherein the communication is a retransmission relating to a transmission, and wherein the transmission is associated with at least one of a different coding rate or a different nominal resource block value than the retransmission, and wherein the transmission and the retransmission are associated with a same TBS.

15. The device of claim 14, wherein the retransmission is configured by a transmitting entity to use a same base graph as the transmission.

16. The device of claim 9, wherein the communication is associated with multiple, different codewords; and
wherein the determination of whether to use the first base graph or the second base graph is performed for each codeword of the multiple, different codewords.

17. A non-transitory computer-readable medium storing one or more instructions for wireless communication that, when executed by one or more processors of a device, cause the device to:
determine a nominal coding rate of a communication based at least in part on a modulation and coding scheme (MCS) of the communication;
determine whether to use a first base graph or a second base graph for decoding or transmission of the communication, wherein the determination of whether to use the first base graph or the second base graph is based at least in part on:
whether both the nominal coding rate satisfies a first coding rate threshold and a transport block size (TBS) of the communication satisfies a first TBS threshold,
whether the nominal coding rate satisfies a second coding rate threshold different than the first coding rate threshold, and
whether the TBS satisfies a second TBS threshold different than the first TBS threshold,
wherein the TBS is based at least in part on a nominal number of resources and the MCS of the communication; and
perform the decoding or transmission based at least in part on the determination of whether to use the first base graph or the second base graph.

18. The non-transitory computer-readable medium of claim 17, wherein the TBS is determined based at least in part on control information of the device.

19. The non-transitory computer-readable medium of claim 17, wherein the TBS is determined based at least in part on at least one rate matching resource in the communication.

20. The non-transitory computer-readable medium of claim 17, wherein the TBS is determined based at least in part on a number of available resource elements in the communication.

21. The non-transitory computer-readable medium of claim 17, wherein the nominal coding rate is a coding rate corresponding to the MCS.

22. The non-transitory computer-readable medium of claim 17, wherein the communication is a retransmission relating to a transmission, and wherein the transmission is associated with at least one of a different coding rate or a different nominal resource block value than the retransmission, and wherein the transmission and the retransmission are associated with a same transport block size.

23. The non-transitory computer-readable medium of claim 22, wherein the retransmission is configured by a transmitting entity to use a same base graph as the transmission.

24. The non-transitory computer-readable medium of claim 17, wherein the communication is associated with multiple, different codewords; and
wherein the determination of whether to use the first base graph or the second base graph is performed for each codeword of the multiple, different codewords.

25. An apparatus for wireless communication, comprising:
means for determining a nominal coding rate of a communication based at least in part on a modulation and coding scheme (MCS) of the communication;
means for determining whether to use a first base graph or a second base graph for decoding or transmission of the communication, wherein the determination of whether to use the first base graph or the second base graph is based at least in part on:
whether both the nominal coding rate satisfies a first coding rate threshold and a transport block size (TBS) of the communication satisfies a first TBS threshold,
whether the nominal coding rate satisfies a second coding rate threshold different than the first coding rate threshold, and
whether the TBS satisfies a second TBS threshold different than the first TBS threshold,
wherein the TBS is based at least in part on a nominal number of resources and the MCS of the communication; and
means for performing the decoding or transmission based at least in part on the determination of whether to use the first base graph or the second base graph.

26. The apparatus of claim 25, wherein the TBS is determined based at least in part on control information of the apparatus.

27. The apparatus of claim 25, wherein the TBS is determined based at least in part on at least one rate matching resource in the communication.

28. The apparatus of claim 25, wherein the TBS is determined based at least in part on a number of available resource elements in the communication.

29. The apparatus of claim 25, wherein the nominal coding rate is a coding rate corresponding to the MCS.

30. The apparatus of claim 25, wherein the communication is a retransmission relating to a transmission, and wherein the transmission is associated with at least one of a different coding rate or a different nominal resource block value than the retransmission, and wherein the transmission and the retransmission are associated with a same transport block size.

31. The apparatus of claim 30, wherein the retransmission is configured by a transmitting entity to use a same base graph as the transmission.

32. The apparatus of claim 25, wherein the communication is associated with multiple, different codewords; and
wherein the determination of whether to use the first base graph or the second base graph is performed for each codeword of the multiple, different codewords.

* * * * *